(12) United States Patent
Zhang

(10) Patent No.: US 12,405,637 B2
(45) Date of Patent: Sep. 2, 2025

(54) FOLDABLE DEVICE AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Jianji Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 18/247,587

(22) PCT Filed: Feb. 13, 2023

(86) PCT No.: PCT/CN2023/075682
§ 371 (c)(1),
(2) Date: Mar. 31, 2023

(87) PCT Pub. No.: WO2024/031948
PCT Pub. Date: Feb. 15, 2024

(65) Prior Publication Data
US 2024/0361811 A1    Oct. 31, 2024

(30) Foreign Application Priority Data

Aug. 10, 2022   (CN) .......................... 202210959483.2

(51) Int. Cl.
*G06F 1/16*   (2006.01)
*H05K 5/02*   (2006.01)

(52) U.S. Cl.
CPC ......... *G06F 1/1681* (2013.01); *H05K 5/0226* (2013.01)

(58) Field of Classification Search
CPC ........ G06F 1/1681; G06F 1/16; G06F 1/1616; G06F 1/1652; G06F 1/1618; H05K 5/0226; H04M 1/0222; H04M 1/0249
See application file for complete search history.

(56) References Cited

U.S. PATENT DOCUMENTS

| | | | |
|---|---|---|---|
| 2007/0279315 A1* | 12/2007 | Laves | H04M 1/0268 345/1.1 |
| 2010/0041439 A1* | 2/2010 | Bullister | G06F 1/165 455/566 |

(Continued)

FOREIGN PATENT DOCUMENTS

| | | |
|---|---|---|
| CN | 107508932 A | 12/2017 |
| CN | 110232869 A | 9/2019 |

(Continued)

OTHER PUBLICATIONS

International Search Report in International application No. PCT/CN2023/075682, mailed on May 29, 2023.

(Continued)

*Primary Examiner* — Sagar Shrestha
(74) *Attorney, Agent, or Firm* — PV IP PC; Wei Te Chung

(57) ABSTRACT

The present disclosure provides a foldable device and a display device, wherein at least one secondary folding axis intersects a primary folding axis and divides the frame plate into a plurality of sub-frame plates, and a folding hinge is configured to enable the foldable device to be folded on the plurality of folding axes, thereby improving a user's experience.

20 Claims, 15 Drawing Sheets

(56) References Cited

U.S. PATENT DOCUMENTS

| | | | | |
|---|---|---|---|---|
| 2014/0375530 A1* | 12/2014 | Delaporte | ............ | G06F 1/1652 |
| | | | | 345/1.3 |
| 2018/0039467 A1* | 2/2018 | Feng | .................... | G09G 3/3208 |
| 2021/0151697 A1* | 5/2021 | Cao | ........................ | H10K 71/00 |
| 2021/0355988 A1* | 11/2021 | Cheng | ................... | G06F 1/1681 |
| 2022/0043480 A1* | 2/2022 | Seo | ......................... | G09F 9/301 |
| 2022/0238049 A1* | 7/2022 | Min | ........................ | G09F 9/301 |
| 2022/0283608 A1* | 9/2022 | Xianyu | ............... | H04M 1/0247 |
| 2022/0303371 A1* | 9/2022 | Liao | ..................... | H04M 1/0268 |
| 2023/0021638 A1* | 1/2023 | Yun | ....................... | G06F 1/1681 |
| 2023/0054249 A1* | 2/2023 | Wu | ........................ | G06F 1/1681 |
| 2023/0320006 A1* | 10/2023 | Gong | .................. | H04M 1/0268 |
| | | | | 361/807 |
| 2024/0044360 A1* | 2/2024 | Zhang | ................... | H04M 1/022 |

FOREIGN PATENT DOCUMENTS

| | | | | |
|---|---|---|---|---|
| CN | 111637147 A | * | 9/2020 | ............. F16C 11/04 |
| CN | 113299195 A | | 8/2021 | |
| CN | 114754065 A | | 7/2022 | |
| CN | 115442459 A | | 12/2022 | |
| JP | 2015109013 A | | 6/2015 | |

OTHER PUBLICATIONS

Written Opinion of the International Search Authority in International application No. PCT/CN2023/075682, mailed on May 29, 2023.
Chinese Office Action issued in corresponding Chinese Patent Application No. 202210959483.2 dated Jan. 26, 2025, pp. 1-7.

* cited by examiner

FOLDABLE DEVICE AND DISPLAY DEVICE

TECHNICAL FIELD

The present disclosure relates to a technical field of electronic apparatuses, and more particularly, to a foldable device and a display device.

BACKGROUND

Recently, OLED display technology has been widely used, and folding mobile phones are more and more popular owe to the OLED display technology. The folding mobile phones are future development trend of mobile phone industry, and thus becoming a research hotspot to mobile phones and panel manufacturers. Meanwhile, foldable tablets and notebook computers also appear. However, conventional folding display devices have only a single folding axis or two folding axes parallel to each other. As such, the conventional folding display device has less folding configuration. With the development of science and technology, more and more user pay attention to user's experience, and therefore display devices having more folding configuration are needed to satisfy the user experience.

Technical Problem

The present disclosure provides a foldable device and a display panel to improve a user' experience.

SUMMARY

The present disclosure provides a foldable device including: a frame plate; one primary folding axis; at least one secondary folding axis, wherein the at least one secondary folding axis does not intersect each other, the at least one secondary folding axis intersects the primary folding axis to divide the frame plate into a plurality of sub-frame plates; and a folding mechanism including a first folding hinge and a second folding hinge; wherein at least one pair of adjacent sub-frame plates located on the primary folding axis are connected by the first folding hinge, at least one pair of adjacent sub-frame plates located on the at least one secondary folding axis are connected by the second folding hinge, and any one of the sub-frame plates is connected to at least one of the first folding hinge or the second folding hinge.

In some embodiments of the present disclosure, the first folding hinge and the second folding hinge include: a first rotating member; a second rotating member; and a first base, wherein an end of the first rotating member is rotatably connected to the first base, and an end of the second rotating member is rotatably connected to the first base; wherein a side of another end of the first rotating member of the first folding hinge is connected to one of the at least one pair of adjacent sub-frame plates located on the primary folding axis, and a side of another end of the second rotating member of the first folding hinge is connected to another of the at least one pair of adjacent sub-frame plates located on the primary folding axis; wherein a side of another end of the first rotating member of the second folding hinge is connected to one of the at least one pair of adjacent sub-frame plates located on the at least one secondary folding axis, and a side of another end of the second rotating member of the second folding hinge is connected to another of the at least one pair of adjacent sub-frame plates located on the at least one secondary folding axis.

In some embodiments of the present disclosure, the first folding hinge and the second folding hinge further include: a first damping mechanism connected to the first base and the first rotating member; and a second damping mechanism connected to the first base and the second rotating member; when the first rotating member is rotated relative to the first base from a first position to a second position by an external force, the first damping mechanism generates a damping force that prevents the first rotating member from rotating, and when the external force is removed, the first damping mechanism holds the first rotating member in the second position; when the second rotating member is rotated relative to the first base from a third position to a fourth position by the external force, the second damping mechanism generates the damping force that prevents the second rotating member from rotating, and when the external force is removed, the second damping mechanism holds the second rotating member in the fourth position.

In some embodiments of the present disclosure, the first damping mechanism includes: a first rotating shaft provided on the first base; a first movable portion, wherein an end of the first movable portion is rotatably connected to the first rotating shaft, and another end of the first movable portion is rotatably connected to the first rotating member; and a first damping portion provided on the first rotating shaft; when the first rotating member is rotated relative to the first base from the first position to the second position by the external force, the first movable portion and the first damping portion are relatively rotated, and a frictional damping force is generated.

In some embodiments of the present disclosure, when the first rotating member is rotated relative to the first base from the first position to the second position by an external force, the first movable portion and the first damping portion are relatively rotated to a set position, and the frictional damping force is generated between the first movable portion and the first damping portion; when the external force is removed, the first movable portion holds the first rotating member in the second position.

In some embodiments of the present disclosure, the first damping portion includes: a first slider slidably disposed on the first rotating shaft; and a first elastic member provided between the first slider and the first base; when the first rotating member is rotated relative to the first base from the first position to the second position by the external force, the first movable portion and the first slider are relatively rotated and press the first elastic member, and the frictional damping force is generated between the first movable portion and the first slider by the first elastic member.

In some embodiments of the present disclosure, the second damping mechanism includes: a second rotating shaft provided on the first base; a second movable portion, wherein an end of the second movable portion is rotatably connected to the second rotating shaft, and another end of the second movable portion is connected to the second rotating member; and a second damping portion provided on the second rotating shaft; when the second rotating member is rotated relative to the first base from the third position to the fourth position by the external force, the second movable portion and the second damping portion are relatively rotated, and a frictional damping force is generated.

In some embodiments of the present disclosure, when the second rotating member is rotated relative to the first base from the third position to the fourth position by the external force, the second movable portion and the second damping portion are relatively rotated to a set position, and the frictional damping force is generated between the second movable portion and the second damping portion; when the external force is removed, the frictional damping force holds the second rotating member in the fourth position.

In some embodiments of the present disclosure, the second damping portion includes: a second slider slidably disposed on the second rotating shaft; and a second elastic member provided between the second slider and the first base; when the second rotating member is rotated relative to the first base from the third position to the fourth position by the external force, the second movable portion and the second slider are relatively rotated and press the second elastic member, and the frictional damping force is generated between the second movable portion and the second slider by the second elastic member.

In some embodiments of the present disclosure, at least one pair of adjacent sub-frame plates located on the primary folding axis are connected by two first folding hinges; wherein the two first folding hinges are connected through a first base plate.

In some embodiments of the present disclosure, the folding mechanism further includes: a hinge structure including a third rotating member, a fourth rotating member, and a second base, wherein an end of the third rotating member is rotatably connected to the second base, and an end of the fourth rotating member is rotatably connected to the second base; wherein the at least one pair of adjacent sub-frame plates located on the primary folding axis are connected by a first hinge structure, wherein a side of another end of the third rotating member of the first hinge structure is connected to one of the at least one pair of adjacent sub-frame plates located on the primary folding axis, and a side of another end of the fourth rotating member of the first hinge structure is connected to another of the at least one pair of adjacent sub-frame plates located on the primary folding axis.

In some embodiments of the present disclosure, the at least one pair of adjacent sub-frame plates located on the at least one secondary folding axis are connected by a second hinge structure; wherein a side of another end of the third rotating member of the second hinge structure is connected to one of the at least one pair of adjacent sub-frame plates located on the secondary folding axis, and a side of another end of the fourth rotating member of the second hinge structure is connected to another of the at least one pair of adjacent sub-frame plates located on the secondary folding axis.

In some embodiments of the present disclosure, the at least one pair of adjacent sub-frame plates located on the at least one secondary folding axis are connected to the second folding hinge by the second hinge structure, and the first base of the second folding hinge is connected to the second base of the second hinge structure by a connecting plate.

In some embodiments of the present disclosure, the secondary folding axis is divided into a first folding section and a second folding section by the primary folding axis, a pair of adjacent sub-frame plates located on the first folding section are connected by the second hinge structure and the second folding hinge, and a pair of adjacent sub-frame plates located on the second folding section are connected by the second hinge structure and the second folding hinge; wherein the first base of the second folding hinge located on the first folding section is connected to the second base of the second hinge structure located on the second folding section by a first connecting plate; and the first base of the second folding hinge located on the second folding section is connected to the second base of the second hinge structure located on the second folding section by a second connecting plate.

In some embodiments of the present disclosure, the first connecting plate and the second connecting plate are connected by a third hinge structure, wherein a side of another end of the third rotating member of the third hinge structure is connected to the first connecting plate, and a side of another end of the fourth rotating member of the third hinge structure is connected to the second connecting plate.

In some embodiments of the present disclosure, the foldable device further includes: a first folding housing provided at a bending region of the first folding section of the secondary folding axis, wherein the first folding housing is provided at a side of the first connecting plate close to the frame plate and is connected to a side of another end of the third rotating member of the third hinge structure, and the first connecting plate; a second folding housing provided at a bending region of the second folding section of the secondary folding axis, wherein the second folding housing is provided at a side of the second connecting plate close to the frame plate and is connected to a side of another end of the fourth rotating member of the third hinge structure, and the second connecting plate; and a third folding housing provided on a side of the third hinge structure close to the frame plate and connected to the second base of the third hinge structure.

In some embodiments of the present disclosure, the hinge structure further includes a second synchronizing mechanism connected between the third rotating member and the fourth rotating member, wherein the second synchronizing mechanism leads the third rotating member and the fourth rotating member to rotate synchronically towards each other or away from each other.

In some embodiments of the present disclosure, the second synchronization mechanism includes: a third link, wherein an end of the third link is hinged to the third rotating member, and another end of the third link is hinged to the fourth rotating member.

In some embodiments of the present disclosure, the second synchronizing mechanism further includes: a third eccentric shaft provided on the third rotating member and paralleled axially to a rotating center of the third rotating member rotating about the second base; and a fourth eccentric shaft provided on the fourth rotating member and paralleled axially to a rotating center of the fourth rotating member rotating about the second base; wherein an end of the third link is hinged to the third eccentric shaft, and another end of the third link is hinged to the fourth eccentric shaft.

In some embodiments of the present disclosure, a display device is provided, wherein the display device includes a foldable device and a display panel. The foldable device includes a frame plate, one primary folding axis, at least one secondary folding axis, wherein the at least one secondary folding axis does not intersect each other, the at least one secondary folding axis intersects the primary folding axis to divide the frame plate into a plurality of sub-frame plates; and a folding mechanism including a first folding hinge and a second folding hinge; wherein at least one pair of adjacent sub-frame plates located on the primary folding axis are connected by the first folding hinge, at least one pair of adjacent sub-frame plates located on the at least one secondary folding axis are connected by the second folding hinge, and any one of the sub-frame plates is connected to at least one of the first folding hinge or the second folding hinge. The display panel is disposed on a side of the frame plate of the foldable device.

Beneficial Effects

A foldable device and a display device are provided in the present disclosure. The foldable device includes a frame plate; one primary folding axis; at least one secondary folding axis, wherein the at least one secondary folding axis does not intersect each other, the at least one secondary folding axis intersects the primary folding axis to divide the frame plate into a plurality of sub-frame plates; and a folding mechanism including a first folding hinge and a second folding hinge; wherein at least one pair of adjacent sub-frame plates located on the primary folding axis are connected by the first folding hinge, at least one pair of adjacent sub-frame plates located on the at least one secondary folding axis are connected by the second folding hinge, and any one of the sub-frame plates is connected to at least one of the first folding hinge or the second folding hinge. According to the foldable device, the at least one secondary folding axis intersects the primary folding axis to divide the frame plate into a plurality of sub-frame plates. The user can use the folding hinges to fold the foldable device along the folding axes, as such, the user' experience is improved.

BRIEF DESCRIPTION OF THE DRAWINGS

In order that the technical solution in the embodiments of the present disclosure may be explained more clearly, references will now be made briefly to the accompanying drawings required for the description of the embodiments. It will be apparent that the accompanying drawings in the following description are merely some of the embodiments of the present disclosure, and other drawings may be made to those skilled in the art without involving any inventive effort.

DETAILED DESCRIPTION OF THE EMBODIMENTS

Figure 1:
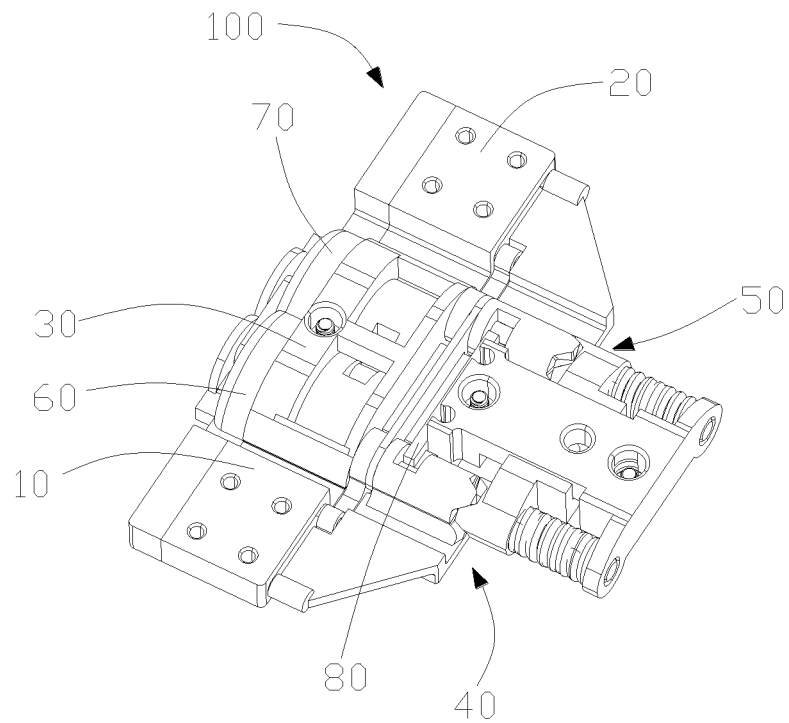
FIG. 1 is a schematic diagram of a folding hinge from a first view according to the present disclosure.

The technical solutions in the embodiments of the present disclosure will be clearly and completely described in connection with the accompanying drawings in the embodiments of the present disclosure. It will be apparent that the described embodiments are merely a part of the embodiments of the present disclosure, rather than all the embodiments. Based on the embodiments in the present disclosure, all other embodiments obtained by a person skilled in the art without any inventive effort are within the scope of the present disclosure.

In the description of this disclosure, it should be understood that the azimuth or positional relationship indicated by the terms "center", "length", "width", "up", "down", "front", "back", "left", "right", "inside", "outside", and the like, is based on the azimuth or positional relationship shown in the drawings, merely to facilitate and simplify the description of this disclosure, and not to indicate or imply that the indicated device or element must have a particular azimuth, be constructed and operated in a particular azimuth, and therefore is not to be construed as limiting the disclosure. Furthermore, the terms "first" and "second" are used for descriptive purposes only and are not to be construed as indicating or implying relative importance or implying the number of indicated technical features. Thus, features defined as "first", "second" may expressly or implicitly include one or more of said features. In the description of this application. "plurality" means two or more, unless otherwise expressly and specifically defined.

In the description of the present disclosure, unless expressly defined and defined otherwise, terms such as "connected with", "connected to", "mounted", "fixed" and the like are to be understood in a broad sense, for example, may be fixedly connected, detachably connected, or as a whole; may be mechanically connected or electrically connected; may be directly connected, indirectly connected through an intermediate medium, connected inside the two elements or interacted between the two elements. It will be appreciated by those of ordinary skill in the art that the foregoing may be understood as a specific meaning within the present invention, depending on the specific circumstances.

The present disclosure provides a folding hinge, a foldable device, and a display device, which are described in detail below. It should be noted that the order in which the following examples are described is not intended to limit the preferred order of the embodiments of the present disclosure.

Figure 2:
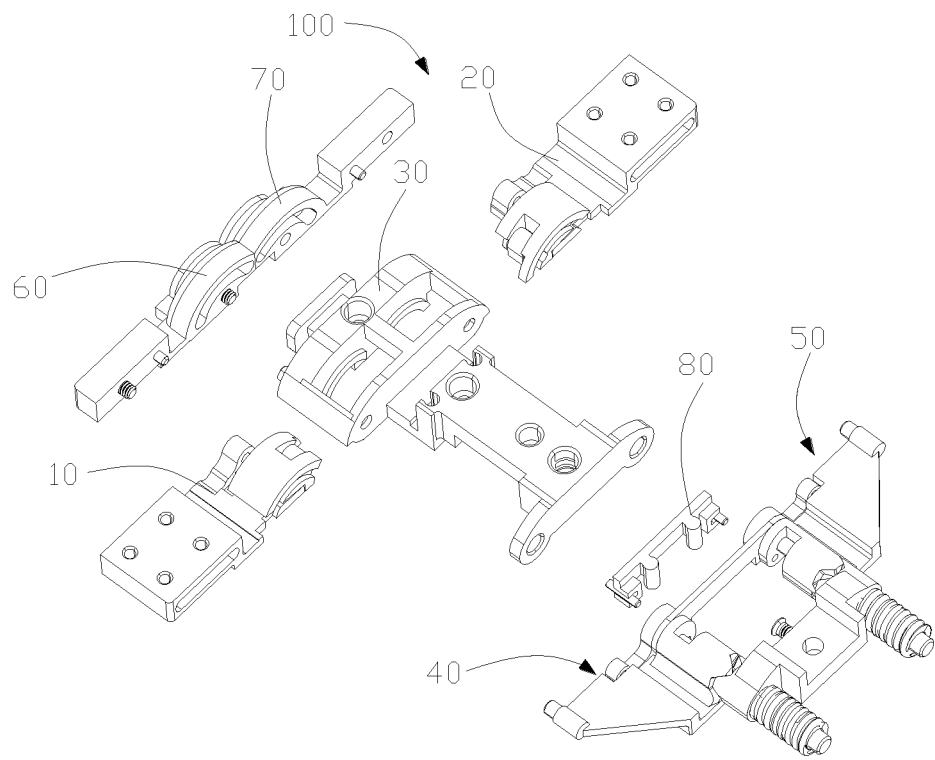
FIG. 2 is an exploded schematic diagram of FIG. 1.
Figure 3:
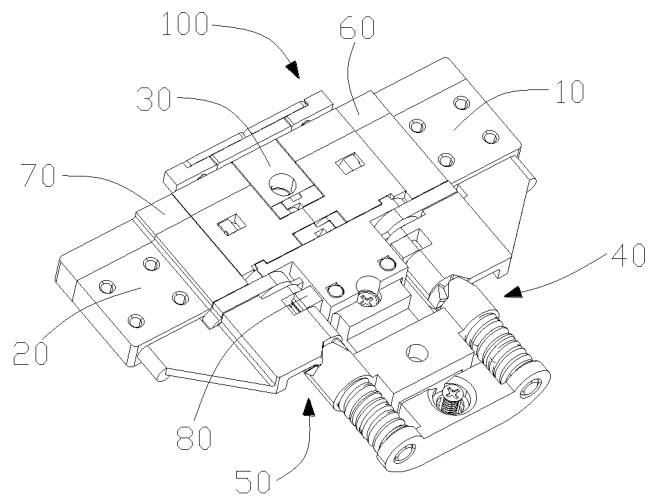
FIG. 3 is a schematic diagram of a folding hinge from a second view according to the present disclosure.
Figure 4:
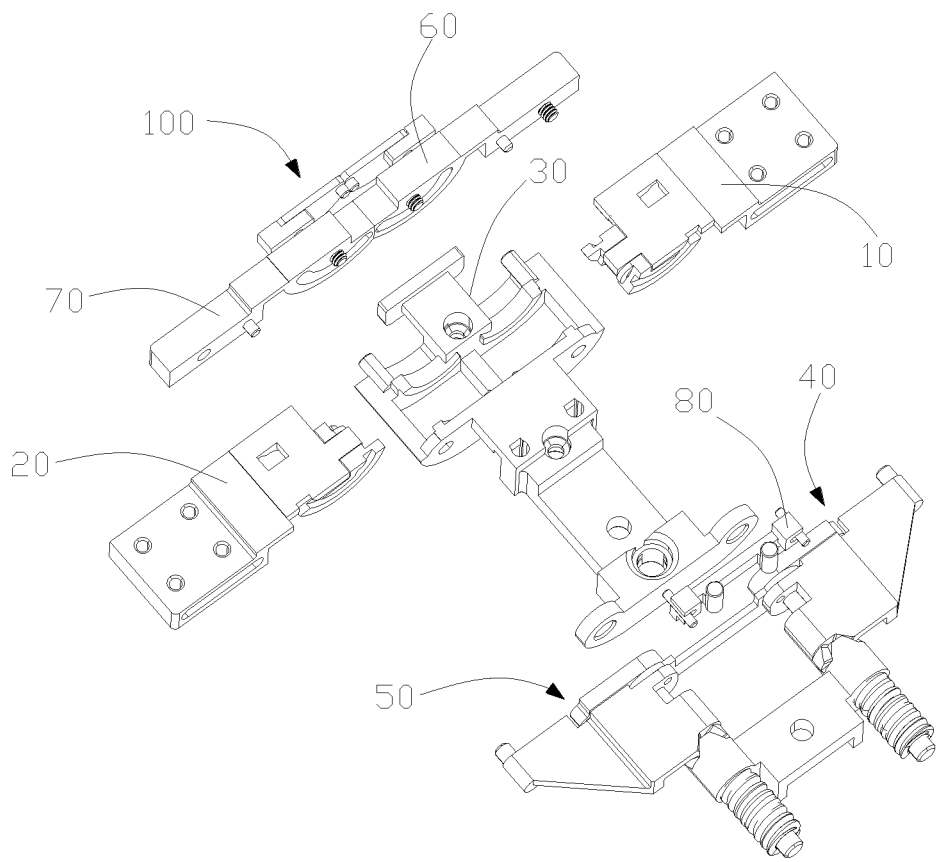
FIG. 4 is an exploded schematic diagram of FIG. 3.
Figure 5:
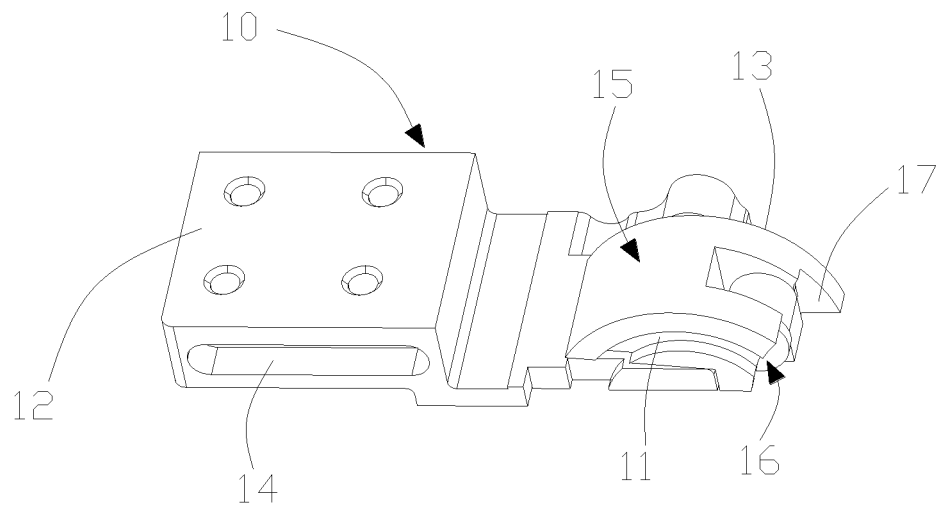
FIG. 5 is a schematic diagram of a first rotating member of a folding hinge according to the present disclosure.

Referring to FIGS. 1-4, FIG. 1 is a schematic diagram of a folding hinge 100 from a first view according to the present disclosure, FIG. 2 is an exploded schematic diagram of FIG. 1, FIG. 3 is a schematic diagram of the folding hinge 100 from a second view according to the present disclosure, and FIG. 4 is an exploded schematic diagram of FIG. 3. A folding hinge 100 is provided, wherein the folding hinge 100 includes a first rotating member 10, a second rotating member 20, a first base 30, a first damping mechanism 40, and a second damping mechanism 50.

An end of the first rotating member 10 is rotatably connected to the first base 30, and an end of the second rotating member 20 is rotatably connected to the first base 30. The first damping mechanism 40 is connected to the first base 30 and the first rotating member 10. The second damping mechanism 50 is connected to the first base 30 and the second rotating member 20. When the first rotating member 10 is rotated from a first position to a second position with respect to the first base 30 by an external force, the first damping mechanism 40 generates a damping force to prevent the first rotating member 10 from rotating, and when the external force is removed, the first damping mechanism 40 holds the first rotating member 10 in the second position. When the second rotating member 20 is rotated from a third position to a fourth position with respect to the first base 30 by an external force, the second damping mechanism 50 generates a damping force to prevent the second rotating member 20 from rotating, and when the external force is removed, the second damping mechanism 50 holds the second rotating member 20 in the fourth position.

In the present disclosure, the first rotating member 10 is hovered by the first damping mechanism 40, the second rotating member 20 is hovered by the second damping mechanism 50. A certain damping sense can be fed back to the user by the damping mechanism, thereby improving the user experience.

It should be noted that, when the first rotating member 10 is in the first position, the damping mechanism may maintain a damping force of a certain magnitude or 0. For example, when the first rotating member 10 is in the first position and the second rotating member 20 is in the third position, and an angle between the first rotating member 10 and the second rotating member 20 is 180°, the damping force of the damping mechanism is 0. When the first rotating member 10 is in the first position, and the angle between the first rotating member 10 and the second rotating member 20 is other than 180°, the damping mechanism maintains the damping force of a certain magnitude.

Figure 6:
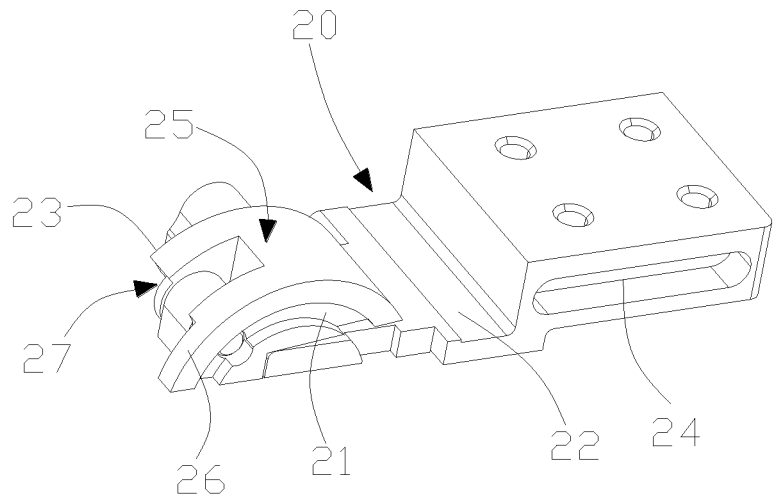
FIG. 6 is a schematic diagram of a second rotating member of a folding hinge according to the present disclosure.
Figure 7:
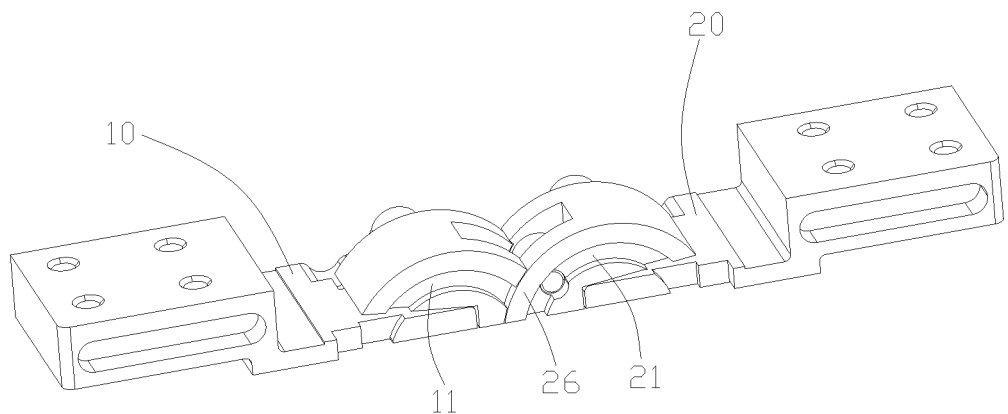
FIG. 7 is a schematic assembled diagram of a first rotating member and a second rotating member of a folding hinge according to the present disclosure.
Figure 8:
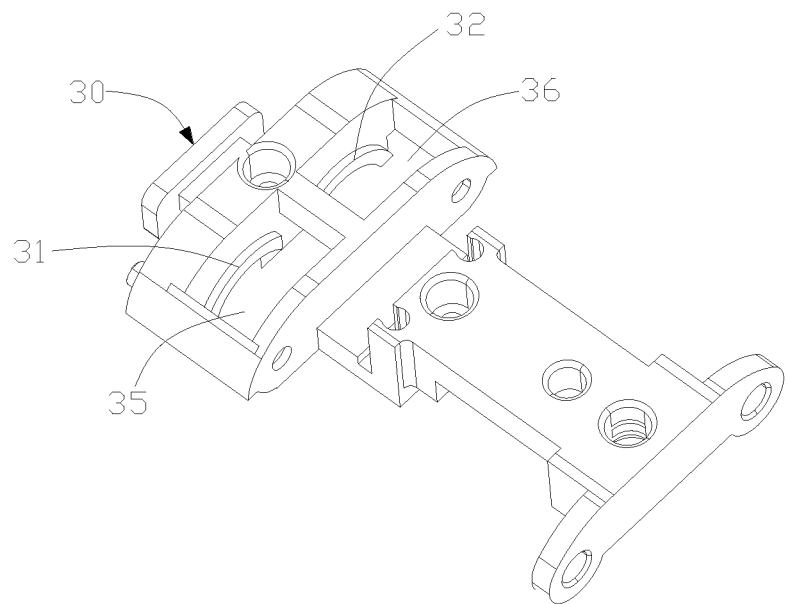
FIG. 8 is a schematic diagram of a first base of a folding hinge from a first view according to the present disclosure.
Figure 9:
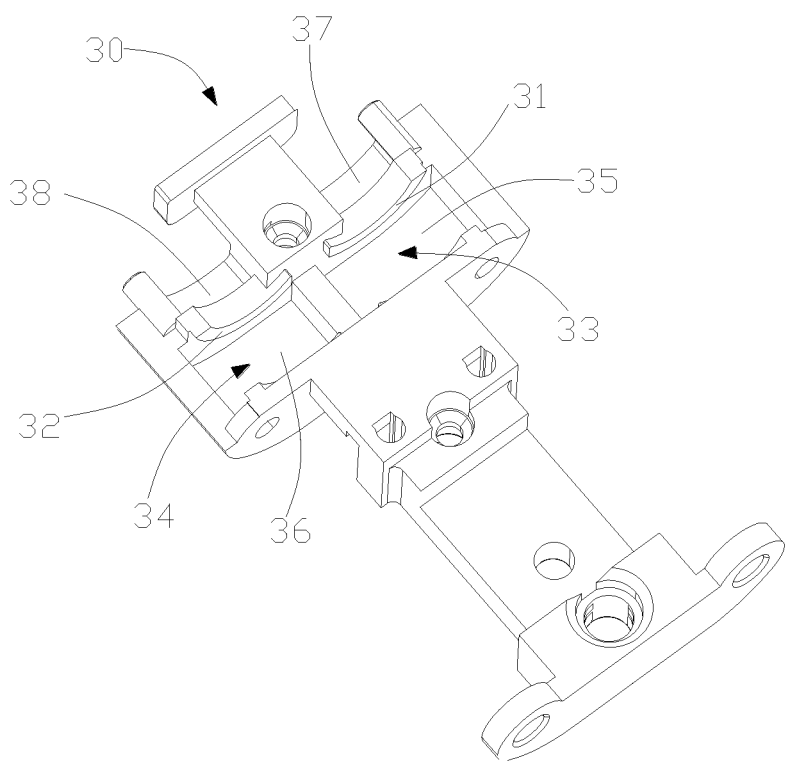
FIG. 9 is a schematic diagram of a first base of a folding hinge from a second view according to the present disclosure.
Figure 10:
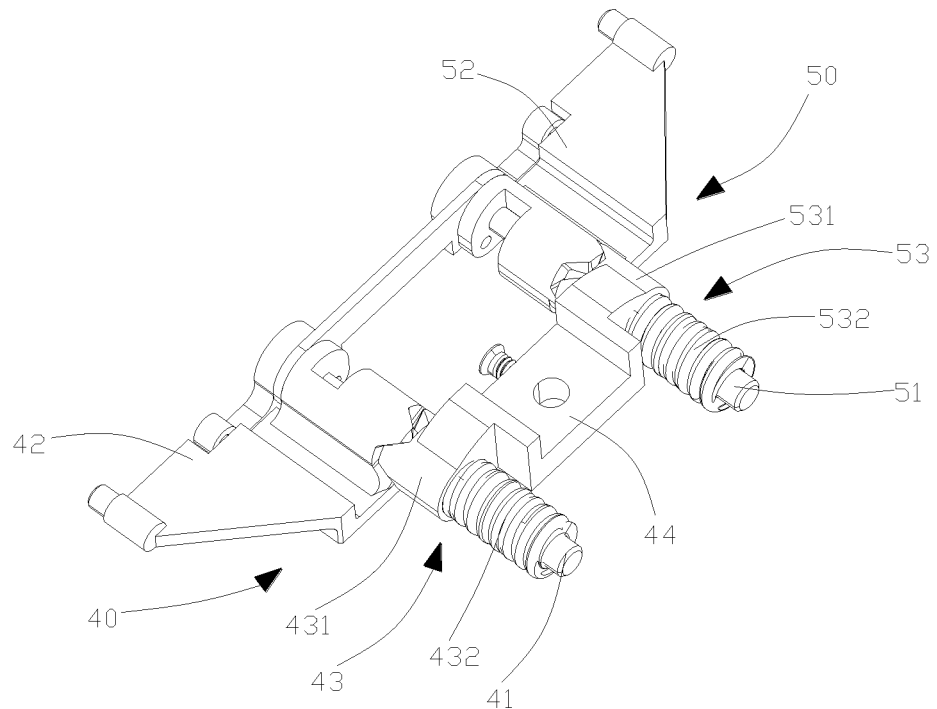
FIG. 10 is a schematic diagram of a first damping mechanism and a second damping mechanism of a folding hinge according to the present disclosure.

Referring to FIGS. 5 to 9, FIG. 5 is a schematic diagram of a first rotating member 10 of a folding hinge 100 according to the present disclosure, FIG. 6 is a schematic diagram of a second rotating member 20 of a folding hinge 100 according to the present disclosure, FIG. 7 is a schematic assembled diagram of the first rotating member 10 and the second rotating member 20 of the folding hinge 100 according to the present disclosure, FIG. 8 is a schematic diagram of a first base 30 of the folding hinge 100 from a first view according to the present disclosure, and FIG. 9 is a schematic diagram of the first base 30 of the folding hinge 100 from a second view according to the present disclosure. In some embodiments, the first base 30 is provided with a first arcuate rail 31 or a first arcuate chute 11, and the first rotating member 10 is provided with a first arcuate chute 11 or a first arcuate rail 31, wherein the first arcuate rail 31 or the first arcuate chute 11 provided on the first base 30 is cooperated with the first arcuate chute 11 or the first arcuate rail 31 provided on the first rotating member 10. Specifically, the first arcuate rail 31 is provided on the first base 30 and the first arcuate chute 11 is provided on the first rotating member 10, and the first arcuate rail 31 is cooperated with the first arcuate chute 11. An end of the first rotating member 10 is rotatably connected to the first base 30 by the engagement of the first arcuate rail 31 with the first arcuate chute 11. It is contemplated that the first rotating member 10 may be rotatably connected to the first base 30 by a rotating shaft so that the end of the first rotating member 10 is rotatably connected to the first base 30.

Further, a first recess 33 is provided on a side of the first base 30, and the first arcuate rail 31 is respectively provided on two opposite side walls of the first recess 33. Specifically, the first rotating member 10 includes a first rotating block 13 and a first rotating plate 12, and the first rotating block 13 is fixed at an end of the first rotating plate 12. The first rotating block 13 is located in the first recess 33, both sides of the first rotating block 13 are respectively provided with the first arcuate chute 11 which cooperates with the first arcuate rail 31. An arcuate surface 15 is provided on a surface of the first rotating block 13 close to a bottom of the first recess 33, so that friction between the first rotating block 13 and the first recess 33 can be reduced. A first through hole 35 is provided at the bottom of the first recess 33, so that the contact between the first rotating block 13 and the first recess 33 can be reduced, thereby further reducing friction between the first rotating block 13 and the first recess 33.

In some embodiments, the first base 30 is provided with a second arcuate rail 32 or a second arcuate chute 21, and the second rotating member 20 is provided with a second arcuate chute 21 or a second arcuate rail 32, wherein the second arcuate rail 32 or the second arcuate chute 21 provided on the first base 30 is cooperated with the second arcuate chute 21 or the second arcuate rail 32 provided on the second rotating member 20. Specifically, the second arcuate rail 32 is provided on the first base 30 and the second arcuate chute 21 is provided on the second rotating member 20, and the second arcuate rail 32 is cooperated with the second arcuate chute 21. The second arcuate chute 21 is engaged by the second arcuate rail 32 so that an end of the second rotating member 20 is rotatably connected to the first base 30. It is contemplated that the second rotating member 20 may be rotatably connected to the first base 30 by a rotating shaft so that the end of the second rotating member 20 is rotatably connected to the first base 30.

Further, in some embodiments of the present disclosure, a second recess 34 is provided on a side of the first base 30, and the second arcuate rail 32 or the second arcuate chute 21 is provided on two opposite side walls of the second recess 34, respectively. Specifically, the second rotating member 20 includes a second rotating block 23 and a second rotating plate 22, the second rotating block 23 is fixed at an end of the second rotating plate 22, and the second rotating block 23 is located in the second recess 34. Both sides of the second rotating block 23 are respectively provided with the second arcuate chute 21 which cooperates with the second arcuate rail 32. An arcuate surface 25 is provided on a surface of the second rotating block 23 close to a bottom of the second recess 34, so that friction between the second rotating block 23 and the second recess 34 can be reduced. A second through hole 36 is provided at the bottom of the second recess 34, so that contact between the second rotating block 23 and the second recess 34 can be reduced, thereby further reducing friction between the second rotating block 23 and the second recess 34.

In some embodiments, when an included angle between the first rotating member 10 and the second rotating member 20 is 180°, an end of the first rotating member 10 abuts against an end of the second rotating member 20. The included angle between the first rotating member 10 and the second rotating member 20 can be defined to range from 0° to 180°, thereby avoiding an excessive rotation. Specifically, the first recess 33 communicates with the second recess 34, and when the included angle between the first rotating member 10 and the second rotating member 20 is 180°, an end of the first rotating block 13 abuts against an end of the second rotating block 23, a first notch 16 is provided on a surface of the first rotating block 13 contacting with the second rotating block 23, and a first clamping block 26 which is cooperated with the first notch 16 is provided on the second rotating block 23. The first rotating block 13 and the second rotating block 23 are engaged by the first notch 16 and the first clamping block 26, and define an angle of 0° to 180° between the first rotating member 10 and the second rotating member 20. Further, a second notch 27 is provided on a surface of the second rotating block 23 contacting with the first rotating block 13, and the first rotating block 13 is provided with a second clamping block 17 which cooperates with the second notch 27.

Further, the folding hinge further includes a first end cover 60 provided on a side of the first base 30, the first damping mechanism 40 is provided on a side of the first base 30 opposite to the first end cover 60, and the first end cover 60 is connected to the first rotating member 10. Specifically, a first connecting hole 37 communicating with the first recess 33 is provided on the first base 30 and at a side of the first base 30 provided with the first end cover 60, and the first end cover 60 is connected to the first rotating member 10 through the first connecting hole 37. The first end cover 60 is provided to prevent dust or impurities from entering the first recess 33.

In addition, the folding hinge further includes a second end cover 70 provided on a side of the first base 30, the second damping mechanism 50 is provided on a side of the first base 30 opposite to the second end cover 70, and the second end cover 70 is connected to the second rotating member 20. Specifically, a second connecting hole 38 communicating with the second recess 34 is provided on the first base 30 and at a side of the first base 30 provided with the second end cover 70, and the second end cover 70 is connected to the second rotating member 20 through the second connecting hole 38. The second end cover 70 is provided to prevent dust or impurities from entering the second recess 34.

Figure 11:
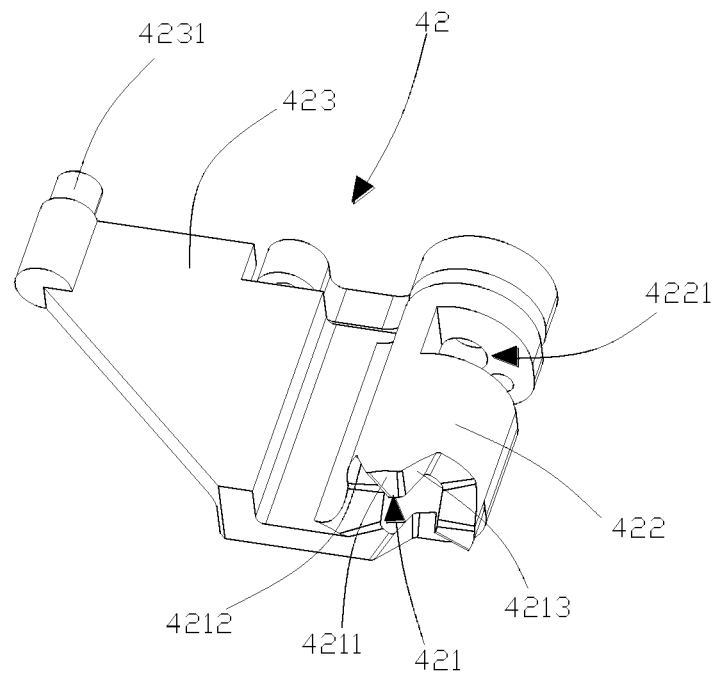
FIG. 11 is a schematic diagram of a first movable portion of a first damping mechanism of a folding hinge according to the present disclosure.
Figure 12:
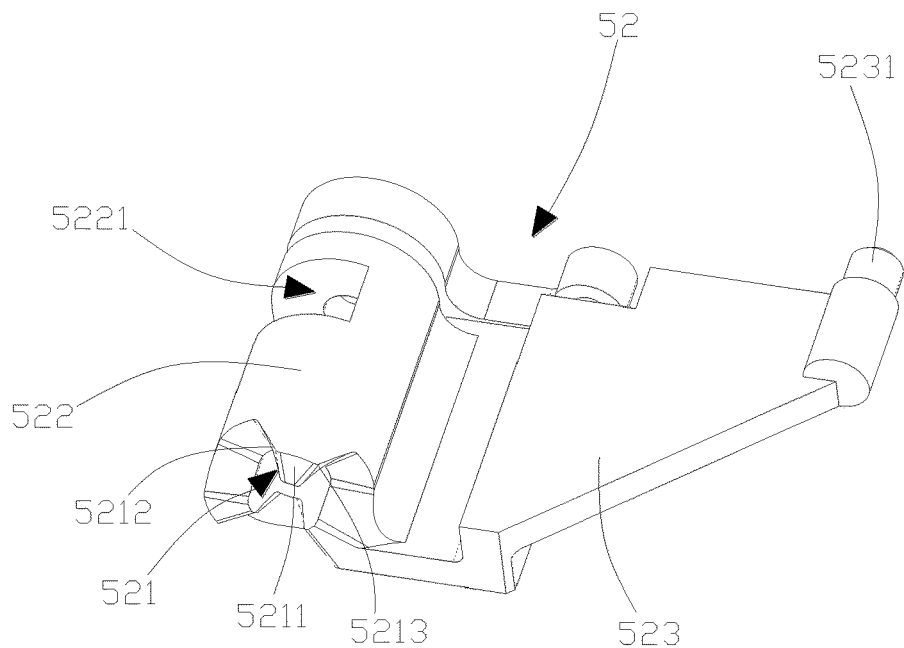
FIG. 12 is a schematic diagram of a second movable portion of a second damping mechanism of a folding hinge according to the present disclosure.
Figure 13:
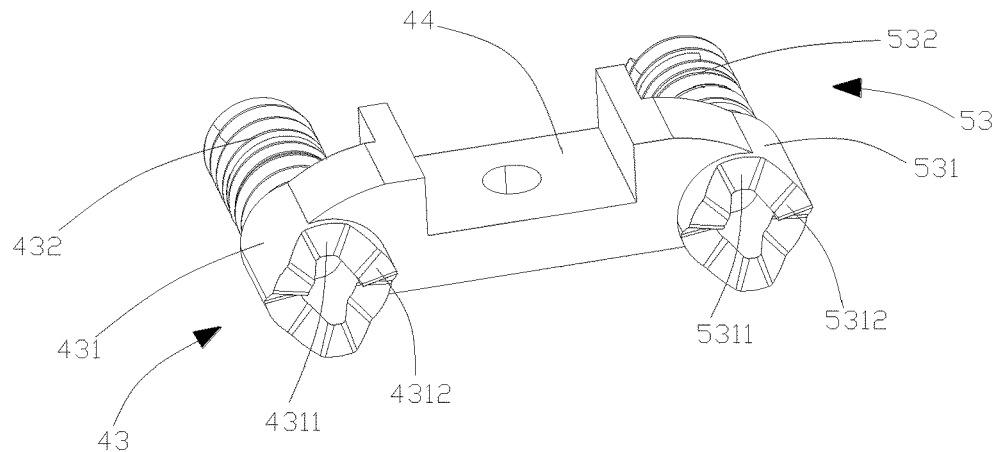
FIG. 13 is a schematic diagram of a first damping portion and a second damping portion of a folding hinge according to the present disclosure.
Figure 14:
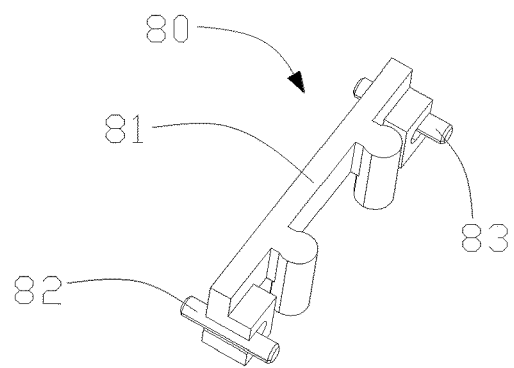
FIG. 14 is a schematic diagram of a first synchronizing mechanism of a folding hinge according to the present disclosure.

Referring to FIGS. 10 to 13, FIG. 10 is a schematic diagram of a first damping mechanism 40 and a second damping mechanism 50 of a folding hinge 100 according to the present disclosure, FIG. 11 is a schematic diagram of a first movable portion 42 of the first damping mechanism 40 of the folding hinge 100 according to the present disclosure, FIG. 12 is a schematic diagram of a second movable portion 52 of the second damping mechanism 50 of the folding hinge 100 according to the present disclosure, and FIG. 13 is a schematic diagram of a first damping portion 43 and a second damping portion 53 of the folding hinge 100 according to the present disclosure.

In some embodiments, the first damping mechanism 40 includes: a first rotating shaft 41 provided on the first base 30; a first movable portion 42, wherein an end of the first movable portion 42 is rotatably connected to the first rotating shaft 41, and another end of the first movable portion 42 is connected to the first rotating member 10; a first damping portion 43 provided on the first rotating shaft 41; wherein, when the first rotating member 10 is rotated from a first position to a second position with respect to the first base 30 by an external force, the first movable portion 42 and the first damping portion 43 are relatively rotated to generate a frictional damping force.

According to the present disclosure, another end of the first movable portion 42 is connected to the first rotating member 10, the first rotating member 10 rotates the first movable portion 42 around the first rotating shaft 41 during its rotation. When the first rotating member 10 rotates relative to the first base 30 from the first position to the second position by the external force, the first movable portion 42 rotates relative to the first damping portion 43 and generates a frictional damping force. When the external force is removed, the frictional damping force causes the first rotating member 10 to remain in the second position.

Specifically, the first movable portion 42 includes a first wing plate 423 and a first sleeve 422, and the first wing plate 423 and the first sleeve 422 are connected. The first sleeve 422 is rotatably connected to the first rotating shaft 41, an end of the first wing plate 423 is connected to the first sleeve 422, and the other end of the first wing plate 423 is connected to the first rotating plate 12. Further, a side of the first rotating plate 12 is provided with a first chute 14 along a rotating radial, and the other end of the first wing plate 423 is provided with a first sliding shaft 4231 cooperated with the first chute 14. The first rotating plate 12 and the first wing plate 423 are slidably connected to each other, thereby avoiding jamming.

In some embodiments, the first damping portion 43 includes: a first slider 431 slidably disposed on the first rotating shaft 41; a first elastic member 432 disposed between the first slider 431 and the first base 30; wherein, when the first rotating member 10 is rotated from the first position to the second position with respect to the first base 30 by an external force, the first movable portion 42 and the first slider 431 are relatively rotated to press the first elastic member 432, and the first elastic member 432 generates a frictional damping between the first movable portion 42 and the first slider 431.

That is, when the first rotating member 10 is rotated from the first position to the second position with respect to the first base 30 by an external force, the first movable portion 42 and the first slider 431 are relatively rotated to press the first elastic member 432, and the first elastic member 432 imparts a reverse force to the first slider 431, so that a frictional damping force is generated on the first movable portion 42 and the first slider 431.

In some embodiments, a first projection 421 is provided on a surface of the first movable portion 42 contacting with the first slider 431, a first recess portion 4311 is provided on a surface of the first slider 431 contacting with the first movable portion 42, and the first recess portion 4311 is cooperated with the first projection 421. A first friction portion 4312 is provided on the surface of the first slider 431 contacting with the first movable portion 42, and the first friction portion 4312 is provided adjacent to the first recess portion 4311. Specifically, the first sleeve 422 is provided with a first projection 421 on a surface of the first sleeve 422 contacting with the first slider 431, and the first recess portion 4311 and the first friction portion 4312 are located in a same circumferential direction.

That is, when the first projection 421 of the first movable portion 42 is aligned and engaged with the first recess portion 4311 of the first slider 431, no frictional damping force is generated between the first movable portion 42 and the first slider 431. When the first movable portion 42 and the first slider 431 are relatively rotated, the first projection 421 of the first movable portion 42 is aligned and engaged with the first frictional portion 4312 of the first slider 431. At this time, the first movable portion 42 presses the first slider 431 and the first elastic member 432, and the first elastic member 432 exerts a reverse force on the first slider 431, so that the first movable portion 42 and the first slider 431 generate frictional damping force.

When the number of the first recess portion 4311 is one, that is, one first recess portion 4311 is provided on the surface of the first slider 431 contacting with the first rotating member 10. The first friction portion 4312 is provided on other portion except for the portion provided with the first recess portion 4311. When the first projection 421 of the first movable portion 42 is aligned and engaged with the first recess portion 4311 of the first slider 431, the first rotating member 10 is in a horizontal state, and the first rotating member 10 has not yet been rotated. When the first rotating member 10 is rotated, the first projection 421 of the first movable portion 42 is aligned and engaged with the first friction portion 4312 of the first slider 431. Since the first friction portion 4312 is provided on other portion of the surface of the first slider 431 contacting with the first moveable portion 42 except for the portion provided with the first recess portion 4311, the first friction portion 4312 can provide damping force to the first rotating member 10 for its continuous hovering. The first rotating member 10 can continue to rotate, as long as the external force overcomes the frictional damping force between the first movable portion 42 and the first slider 431. When the external force is removed, the frictional damping force between the first movable portion 42 and the first slider 431 causes the first rotating member 10 to hover.

Further, the first elastic member 432 comprises a spring sleeved on the first rotating shaft 41, wherein the spring is located between the first slider 431 and the first base 30. When the first projection 421 of the first movable portion 42 is aligned and engaged with the first frictional portion 4312 of the first slider 431, the first movable portion 42 presses the first slider 431 and the spring, and the spring imparts a reverse force to the first slider 431 so that a frictional damping force is generated between the first movable portion 42 and the first slider 431. In other embodiments of the present disclosure, the first elastic member 432 includes a spring washer sleeved on the first rotating shaft 41 and is located between the first slider 431 and the first base 30.

In some embodiments, the first recess portion 4311 includes an arcuate groove. Further, a side wall of the arcuate groove is an arcuate curved surface, and a bottom surface of the arcuate groove is a plane surface. The first recess portion 4311 is provided as an arcuate groove, so that the first projection 421 and the first recess portion 4311 can rotate relatively smoothly, thereby avoiding the occurrence of jamming. The first friction portion 4312 includes a first contact surface on the same circumference as the first recess portion 4311. The first contact surface includes a non-smooth surface provided with a particle projection to increase the friction force, thereby increasing the friction damping force between the first friction portion 4312 and the first projection 421.

Further, the first projection 421 includes a second contact surface 4211, a first arcuate curved surface 4212 and a second arcuate curved surface 4213, wherein the second contact surface 4211 protrudes toward the first slider 431, the first arcuate curved surface 4212 is connected between an end of the second contact surface 4211 and the first movable portion 42, and the second arcuate curved surface 4213 is connected between the other end of the second contact surface 4211 and the first movable portion 42. The first projection 421 has two arcuate curved surfaces, and the first arcuate curved surface 4212 and the second arcuate curved surface 4213 correspond to the side walls of the arcuate grooves, respectively, so that the friction force between the first projection 421 and the first recess portion 4311 is further reduced, and the first projection 421 and the first recess portion 4311 are more smoothly rotated relative to each other. Further, the second contact surface 4211 includes a non-smooth surface provided with a particle projection to increase the friction force, thereby increasing the friction damping force between the first friction portion 4312 and the first projection 421.

In some embodiments, when the first rotating member 10 is rotated relative to the first base 30 from the first position to the second position by an external force, the first movable portion 42 and the first damping portion 43 are relatively rotated to a set position, and a frictional damping force is generated between the first movable portion 42 and the first damping portion 43. When the external force is removed, the first movable portion 42 holds the first rotating member 10 in the second position.

That is, the first movable portion 42 and the first damping portion 43 are relatively rotated to the set position, and a frictional damping force is generated between the first movable portion 42 and the first damping portion 43 so that the first rotating member 10 can be hovered at the set position.

Further, a surface of the first slider 431 contacting with the first movable portion 42 is provided with a plurality of first recess portions 4311 in a same circumferential, and a first friction portion 4312 is provided between adjacent first recess portions 4311. By providing a plurality of first recess portions 4311, and providing a first friction portion 4312 between adjacent first recess portions 4311, the first projection portions 421 can cooperate with the plurality of first recess portions 4311 or the plurality of first friction portions 4312. When the first movable portion 42 and the first damping portion 43 are relatively rotated to a position in which the first projection 421 is aligned and engaged with the first friction portion 4312, a frictional damping force is generated between the first movable portion 42 and the first damping portion 43, so that the first rotating member 10 can be hovered at a set position. Since the first projection 421 cooperates with the plurality of first recess portions 4311 or the plurality of first friction portions 4312, a plurality of hovering positions is provided, thereby hovering the first rotating member 10 at a plurality of rotation angles.

Referring to FIGS. 10 to 13, FIG. 10 is a schematic diagram of a first damping mechanism 40 and a second damping mechanism 50 of a folding hinge 100 according to the present disclosure, FIG. 11 is a schematic diagram of a first movable portion 42 of the first damping mechanism 40 of the folding hinge 100 according to the present disclosure, FIG. 12 is a schematic diagram of a second movable portion 52 of the second damping mechanism 50 of the folding hinge 100 according to the present disclosure, and FIG. 13 is a schematic diagram of a first damping portion 43 and a second damping portion 53 of the folding hinge 100 according to the present disclosure.

In some embodiments, the second damping mechanism 50 includes: a second rotating shaft 51 provided on the first base 30; a second movable portion 52, wherein an end of the second movable portion 52 is rotatably connected to the second rotating shaft 51, and another end of the second movable portion 52 is connected to the second rotating member 20; a second damping portion 53 provided on the second rotating shaft 51; wherein, when the second rotating member 20 is rotated from a third position to a fourth position with respect to the first base 30 by an external force, the second movable portion 52 and the second damping portion 53 are relatively rotated to generate a frictional damping force.

According to the present disclosure, another end of the second movable portion 52 is connected to the second rotating member 20, the second rotating member 20 rotates the second movable portion 52 around the second rotating shaft 51 during its rotation. When the second rotating member 20 rotates relative to the first base 3 from the third position to the fourth position 0 by the external force, the second movable portion 52 rotates relative to the second damping portion 53 and generates a frictional damping force. When the external force is removed, the frictional damping force causes the second rotating member 20 to remain in the fourth position.

Specifically, the second movable portion 52 includes a second wing plate 523 and a second sleeve 522, and the second wing plate 523 and the second sleeve 522 are connected. The second sleeve 522 is rotatably connected to the second rotating shaft 51, an end of the second wing plate 523 is connected to the second sleeve 522, and the other end of the second wing plate 523 is connected to the second rotating plate 22. Further, a side of the second rotating plate 22 is provided with a second chute 24 along a rotating radial, and the other end of the second wing plate 523 is provided with a second sliding shaft 5231 cooperated with the second chute 24. The second rotating plate 22 and the second wing plate 523 are slidably connected to each other, thereby avoiding jamming.

In some embodiments, the second damping portion 53 includes: a second slider 531 slidably disposed on the second rotating shaft 51; a second elastic member 532 disposed between the second slider 531 and the first base 30; wherein, when the second rotating member 20 is rotated from the third position to the fourth position with respect to the first base 30 by an external force, the second movable portion 52 and the second slider 531 are relatively rotated to press the second elastic member 532, and the second elastic member 532 generates a frictional damping between the second movable portion 52 and the second slider 531.

That is, when the second rotating member 20 is rotated from the third position to the fourth position with respect to the first base 30 by an external force, the second movable portion 52 and the second slider 531 are relatively rotated to press the second elastic member 532, and the second elastic member 532 imparts a reverse force to the second slider 531, so that a frictional damping force is generated on the second movable portion 52 and the second slider 531.

In some embodiments, a second projection 521 is provided on a surface of the second movable portion 52 contacting with the second slider 531, a second recess portion 5311 is provided on a surface of the second slider 531 contacting with the second movable portion 52, and the second recess portion 5311 is cooperated with the second projection 521. A second friction portion 5312 is provided on the surface of the second slider 531 contacting with the second movable portion 52. and the second friction portion 5312 is provided adjacent to the second recess portion 5311. Specifically, the second recess portion 5311 and the second friction portion 5312 are located in a same circumferential direction.

That is, when the second projection 521 of the second movable portion 52 is aligned and engaged with the second recess portion 5311 of the second slider 531, no frictional damping force is generated between the second movable portion 52 and the second slider 531. When the second movable portion 52 and the second slider 531 are relatively rotated, the second projection 521 of the second movable portion 52 is aligned and engaged with the second frictional portion 5312 of the second slider 531. At this time, the second movable portion 52 presses the second slider 531 and the second elastic member 532, and the second elastic member 532 exerts a reverse force on the second slider 531, so that the second movable portion 52 and the second slider 531 generate frictional damping force.

When the number of the second recess portion 5311 is 1, that is, one second recess portion 5311 is provided on the surface of the second slider 531 contacting with the second rotating member 20. The second friction portion 5312 is provided on other portion except for the portion provided with the second recess portion 5311. When the second projection 521 of the second movable portion 52 is aligned and engaged with the second recess portion 5311 of the second slider 531, the second rotating member 20 is in a horizontal state, and the second rotating member 20 has not yet been rotated. When the second rotating member 20 is rotated, the second projection 521 of the second movable portion 52 is aligned and engaged with the second friction portion 5312 of the second slider 531. Since the second friction portion 5312 is provided on other portion of the surface of the second slider 531 contacting with the second moveable portion 52 except for the portion provided with the second recess portion 5311, the second friction portion 5312 can provide damping force to the second rotating member 20 for its continuous hovering. The second rotating member 20 can continue to rotate, as long as the external force overcomes the frictional damping force between the second movable portion 52 and the second slider 531. When the external force is removed, the frictional damping force between the second movable portion 52 and the second slider 531 causes the second rotating member 20 to hover.

Further, the second elastic member 532 comprises a spring sleeved on the second rotating shaft 51, wherein the spring is located between the second slider 531 and the first base 30. When the second projection 521 of the second movable portion 52 is aligned and engaged with the second frictional portion 5312 of the second slider 531, the second movable portion 52 presses the second slider 531 and the spring, and the spring imparts a reverse force to the second slider 531 so that a frictional damping force is generated between the second movable portion 52 and the second slider 531. In other embodiments of the present disclosure, the second elastic member 532 includes a spring washer sleeved on the second rotating shaft 51 and is located between the second slider 531 and the first base 30.

In some embodiments, the second recess portion 5311 includes an arcuate groove. Further, a side wall of the arcuate groove is an arcuate curved surface, and a bottom surface of the arcuate groove is a plane surface. The second recess portion 5311 is provided as an arcuate groove, so that the second projection 521 and the second recess portion 5311 can rotate relatively smoothly, thereby avoiding the occurrence of jamming. The second friction portion 5312 includes a second contact surface on the same circumference as the second recess portion 5311. The second contact surface includes a non-smooth surface provided with a particle projection to increase the friction force, thereby increasing the friction damping force between the second friction portion 5312 and the second projection 521.

Further, the second projection 521 includes a fourth contact surface 5211, a third arcuate curved surface 5212 and a fourth arcuate curved surface 5213, wherein the fourth contact surface 5211 protrudes toward the second slider 531, the third arcuate curved surface 5212 is connected between an end of the fourth contact surface 5211 and the second movable portion 52. and the fourth arcuate curved surface 5213 is connected between the other end of the fourth contact surface 5211 and the second movable portion 52. The second projection 521 has two arcuate curved surfaces, and the third arcuate curved surface 5212 and the fourth arcuate curved surface 5213 correspond to the side walls of the arcuate grooves, respectively, so that the friction force between the second projection 521 and the second recess portion 5311 is further reduced, and the second projection 521 and the second recess portion 5311 are more smoothly rotated relative to each other. Further, the fourth contact surface 5211 includes a non-smooth surface provided with a particle projection to increase the friction force, thereby increasing the friction damping force between the second friction portion 5312 and the second projection 521.

In some embodiments, when the second rotating member 20 is rotated relative to the first base 30 from the third position to the fourth position by an external force, the second movable portion 52 and the second damping portion 53 are relatively rotated to a set position, and a frictional damping force is generated between the second movable portion 52 and the second damping portion 53. When the external force is removed, the frictional damping force holds the second rotating member 20 in the second position.

That is, the second movable portion 52 and the second damping portion 53 are relatively rotated to the set position, and a frictional damping force is generated between the second movable portion 52 and the second damping portion 53 so that the second rotating member 20 can be hovered at the set position.

Further, a surface of the second slider 531 contacting with the second movable portion 52 is provided with a plurality of second recess portions 5311 in a same circumferential, and a first second portion 5312 is provided between adjacent second recess portions 5311. By providing a plurality of second recess portions 5311, and providing a second friction portion 5312 between adjacent second recess portions 5311, the second projection portions 521 can cooperate with the plurality of second recess portions 5311 or the plurality of second friction portions 5312. When the second movable portion 52 and the second damping portion 53 are relatively rotated to a position in which the second projection 521 is aligned and engaged with the second friction portion 5312, a frictional damping force is generated between the second movable portion 52 and the second damping portion 53, so that the second rotating member 20 can be hovered at a set position. Since the second projection 521 cooperates with the plurality of second recess portions 5311 or the plurality of second friction portions 5312, a plurality of hovering positions is provided, thereby hovering the second rotating member 20 at a plurality of rotation angles.

In some embodiments, the first slider 431 is connected to the second slider 531 by a second link 44. By connecting the first slider 431 to the second slider 531 by the second link 44, the first slider 431 and the second slider 531 can be kept sliding synchronously, thereby ensuring that the first damping mechanism 40 and the second damping mechanism 50 generate the same frictional damping force, while preventing the first slider 431 and the second slider 531 from rotating.

Referring to FIGS. 1-14, FIG. 14 is a schematic diagram of a first synchronizing mechanism 80 of a folding hinge 100 according to the present disclosure. In some embodiments, the folding hinge 100 further includes a first synchronizing mechanism 80 connected between the first damping mechanism 40 and the second damping mechanism 50. The first synchronizing mechanism 80 leads the first rotating member 10 and the second rotating member 20 to rotate synchronically towards or away from each other.

The first synchronizing mechanism 80 is provided to rotate synchronically the first rotating member 10 and the second rotating member 20 towards or away from each other, such that the first rotating member 10 and the second rotating member 20 remains a same rotating angle.

Further, the first synchronizing mechanism 80 includes a first link 81, wherein an end of the first link 81 is hinged to the first movable portion 42 of the first damping mechanism 40, and the other end of first link 81 is hinged to the second movable portion 52 of the second damping mechanism 50. The first movable part 42 of the first damping mechanism 40 and the second movable part 52 of the second damping mechanism 50 are driven by the first link 81 to rotate synchronically towards or away from each other. Specifically, the end of the first link 81 is hinged to the first sleeve 422 of the first movable portion 42, and the other end of the first link 81 is hinged to the second sleeve 522 of the second movable portion 52.

Further, the first synchronizing mechanism 80 further includes a first eccentric shaft 82 and a second eccentric shaft 83. The first eccentric shaft 82 is provided on the first movable portion 42 in parallel with the first rotating shaft 41. The second eccentric shaft 83 is provided on the second movable portion 52 in parallel with the second rotating shaft 51. The end of the first link 81 is hinged to the first eccentric shaft 82, and the other end of the first link 81 is hinged to the second eccentric shaft 83. Specifically, the first eccentric shaft 82 is provided on the first sleeve 422 in parallel with the first rotating shaft 41, and the second eccentric shaft 83 is provided on the second sleeve 522 in parallel with the second rotating shaft 51. In addition, a first mounting notch 4221 provided on a wall of the first sleeve 422 towards the second sleeve 522, and the first eccentric shaft 82 is provided in the first mounting notch 4221. A second mounting notch 5221 is provided on a wall of the second sleeve 522 towards the first sleeve 422, and the second eccentric shaft 83 is provided in the second mounting notch 5221. As such, the compactness of the first synchronizing mechanism 80 can be improved and the occupied area can be reduced. The radian of the first mounting notch 4221 is greater than or equal to 180°, and the radian of the second mounting notch 5221 is greater than or equal to 180°.

Figure 15:
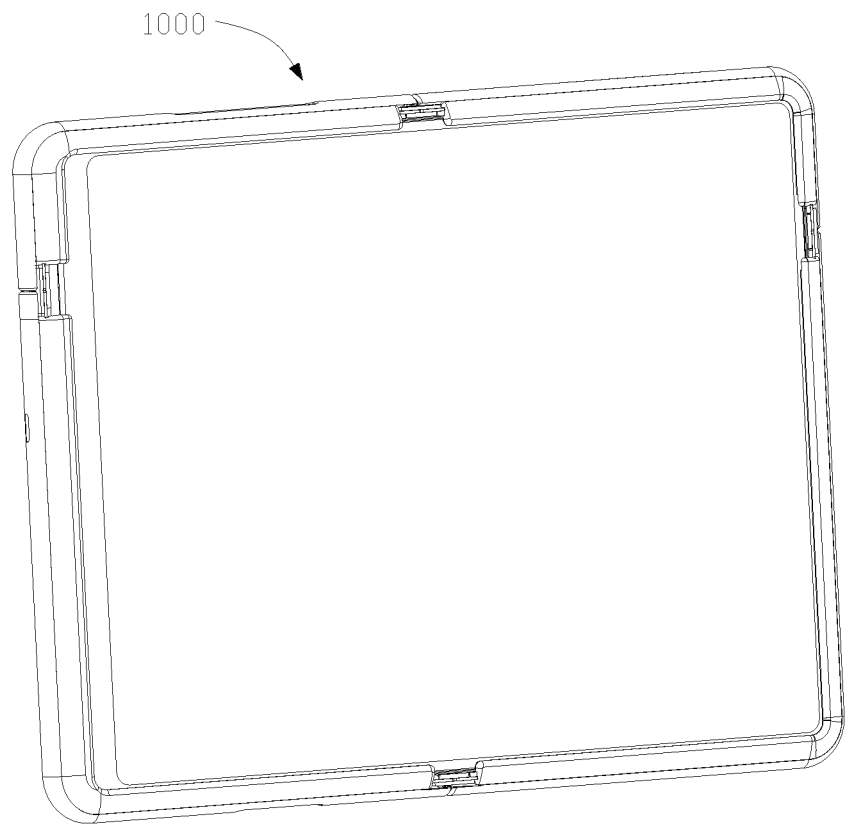
FIG. 15 is a schematic diagram of a foldable device according to the present disclosure.
Figure 16:
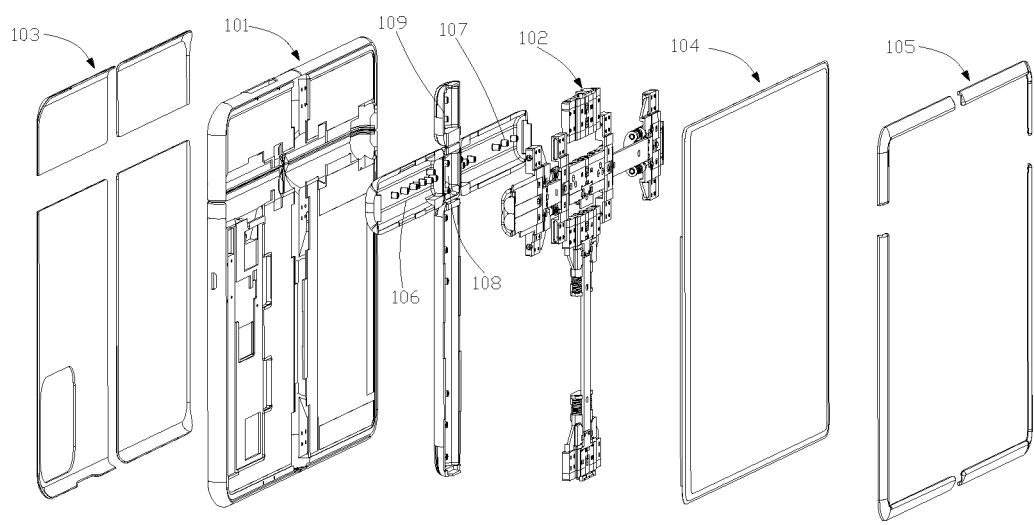
FIG. 16 is an exploded schematic diagram of FIG. 15.
Figure 17:
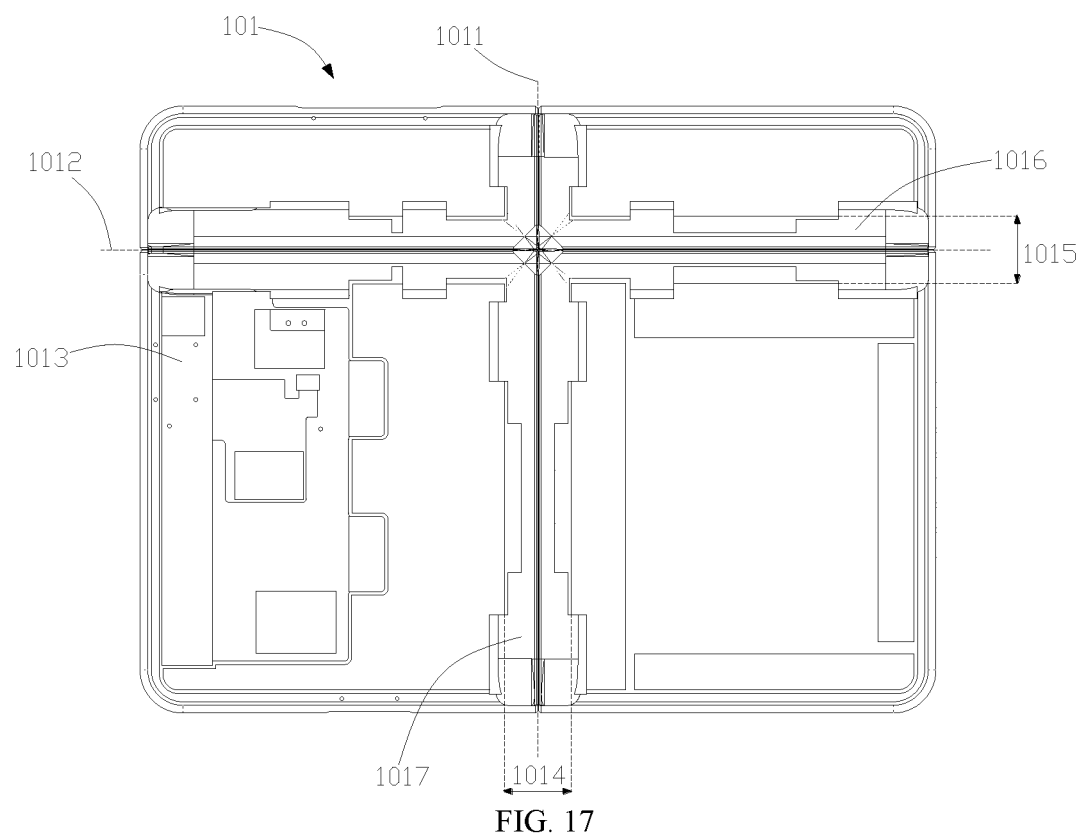
FIG. 17 is a schematic diagram of a frame plate of a foldable device according to the present disclosure.
Figure 18:
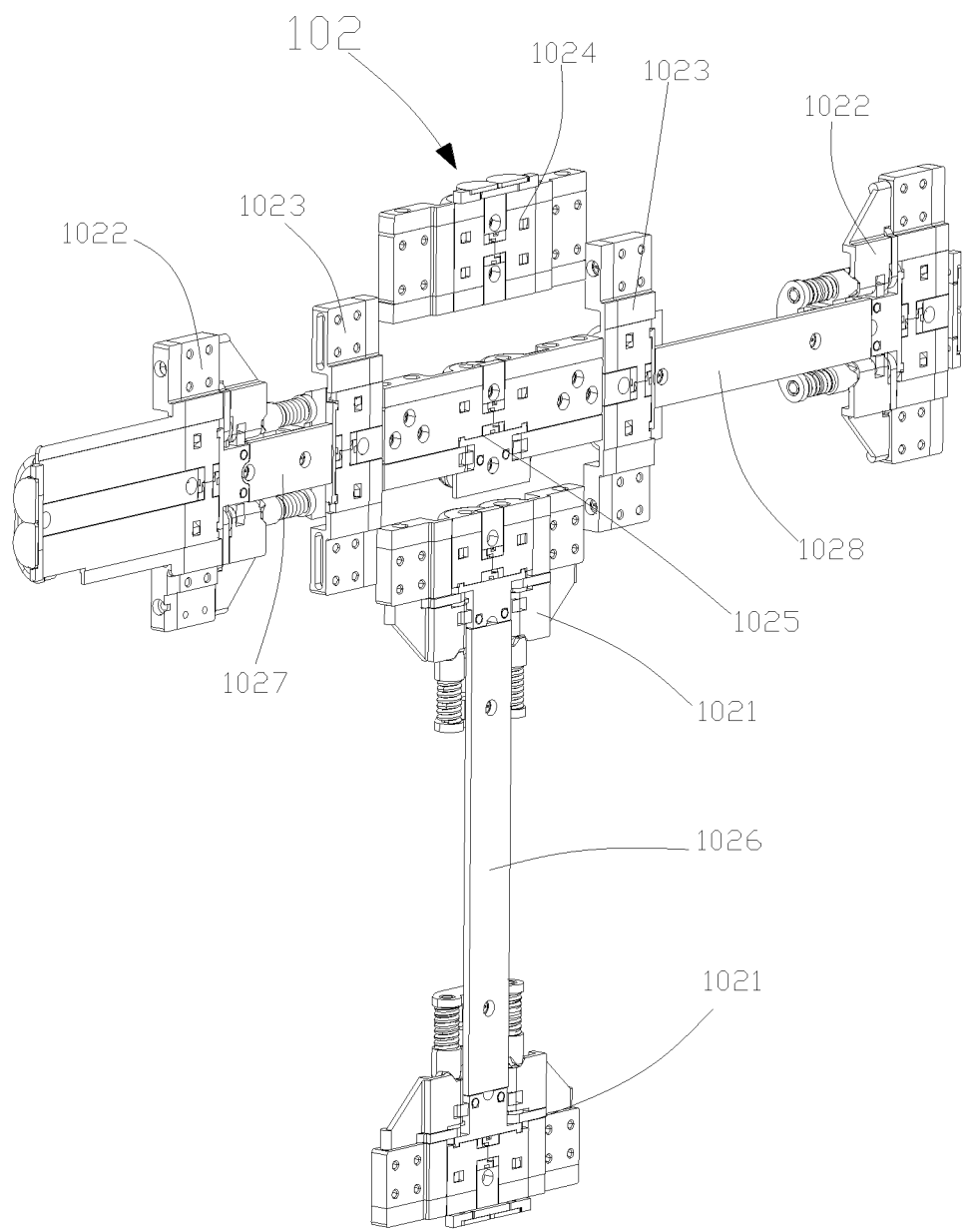
FIG. 18 is a schematic diagram of a folding mechanism of a foldable device according to the present disclosure.
Figure 19:
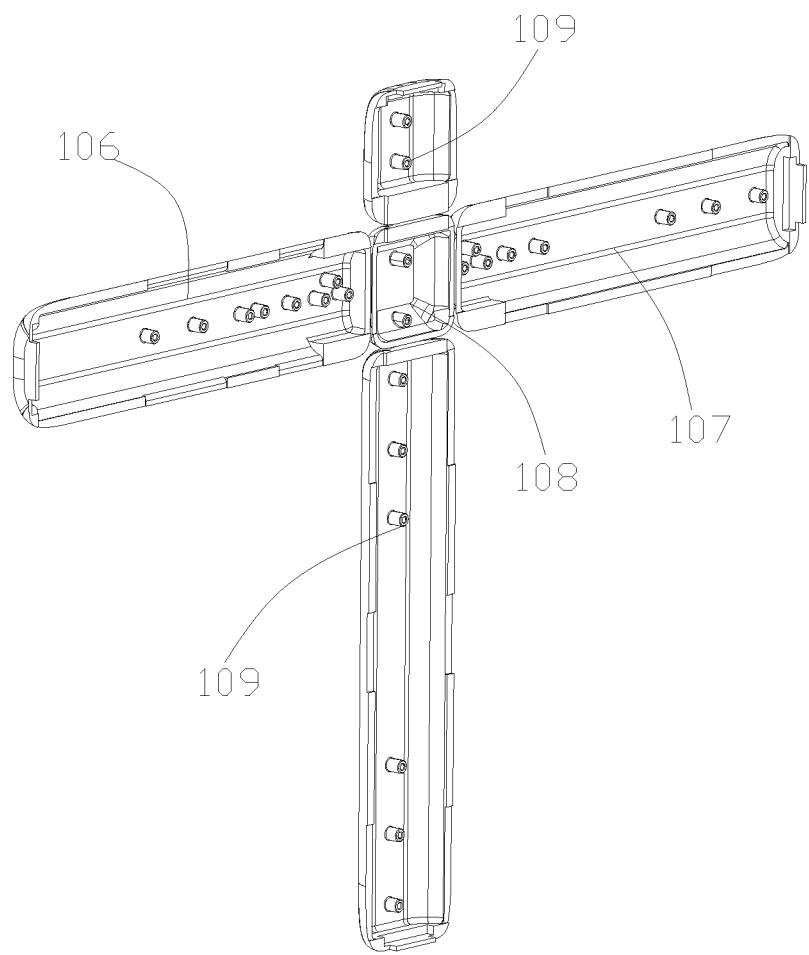
FIG. 19 is a schematic diagram of a folded housing of a foldable device according to the present disclosure.

Referring to FIGS. 15 to 18, FIG. 15 is a schematic diagram of a foldable device 1000 according to the present disclosure, FIG. 16 is an exploded schematic diagram of FIG. 15, FIG. 17 is a schematic diagram of a frame plate 101 of the foldable device 1000 according to the present disclosure, and FIG. 18 is a schematic diagram of a folding mechanism 102 of the foldable device 1000 according to the present disclosure. Accordingly, an embodiment of the present disclosure also provides a foldable device 1000 including a frame plate 101, one primary folding axis 1011, at least one secondary folding axis 1012, and a folding mechanism 102.

The at least one secondary folding axis 1012 does not intersect each other, and the at least one secondary folding axis 1012 intersects the primary folding axis 1011 to divide the frame plate 101 into a plurality of sub-frame plates 1013.

The primary folding axis 1011 and the secondary folding axis 1012 are folding axes of the foldable device 1000, that is, the foldable device 1000 can be folded along the primary folding axis 1011 or the secondary folding axis 1012. The at least one secondary folding axis 1012 intersects the primary folding axis 1011 to divide the frame plate 101 into a plurality of sub-frame plates 1013, that is, the primary folding axis 1011 divides the frame plate 101 into two parts, and the at least one secondary folding axis 1012 divides the two parts into a plurality of sub-frame plates 1013. For example, if only one secondary folding axis 1012 is provided, the frame plate 101 is divided into four sub-frame plates 1013; and if two secondary folding axes 1012 are provided, the frame plate 101 is divided into six sub-frame plates 1013.

The folding mechanism 102 includes a first folding hinge 1021 and a second folding hinge 1022. At least one pair of adjacent sub-frame plates 1013 located on the primary folding axis 1011 are connected by the first folding hinge 1021, at least one pair of adjacent sub-frame plates 1013 located on the at least one secondary folding axis 1012 are connected by the second folding hinge 1022, and any one of the sub-frame plates 1013 is connected to at least one first folding hinge 1021 or second folding hinge 1022. Take providing only one secondary folding axis for example, the frame plate 101 is divided into four sub-frame plates 1013, two pairs of adjacent sub-frame plates 1013 are provided on the primary folding axis 1011, and the adjacent sub-frame plates 1013 are provided on two sides of the primary folding axis 1011, respectively. There are two pairs of adjacent sub-frame plates 1013 located on the secondary folding axis 1012, and the adjacent sub-frame plates 1013 are located on two sides of the secondary folding axis 1012, respectively. Any one of the sub-frame plates 1013 is connected to at least one first folding hinge 1021 or second folding hinge 1022, that is, it is ensured that at least one folding hinge and any one of the sub-frame plates 1013 are provided on the primary folding axis 1011 and the sub-folding axis 1012.

Specifically, a side of the other end of the first rotating member 10 of the first folding hinge 1021 is connected to one sub-frame plate 1013 of at least one pair of adjacent sub-frame plates 1013 located on the primary folding axis 1011, and a side of the other end of the second rotating member 20 of the first folding hinge 1021 is connected to the other sub-frame plate 1013 of at least one pair of adjacent sub-frame plates 1013 located on the primary folding axis 1011. A side of the other end of the first rotating member 10 of the second folding hinge 1022 is connected to one sub-frame plate 1013 of at least one pair of adjacent sub-frame plates 1013 located on the at least one secondary folding axis 1012, and a side of the other end of the second rotating member 20 of the second folding hinge 1022 is connected to the other sub-frame plate 1013 of at least one pair of adjacent sub-frame plates 1013 located on the at least one secondary folding axis 1012.

It should be noted that the primary folding axis 1011 and the secondary folding axis 1012 are virtual axes generated by the foldable device 1000 of the present disclosure during the folding process. The foldable device 1000 of the present disclosure places the frame plate 101 on one side of the first folding hinge 1021 and the second folding hinge 1022, so that the sub-frame plate 1013 can be folded along the primary folding axis 1011 and the secondary folding axis 1012. Furthermore, the foldable device 1000 of the present disclosure has not only a folding direction along the primary folding axis 1011 but also a folding direction along the secondary folding axis 1012, and the primary folding axis 1011 and the secondary folding axis 1012 are intersected, so that the foldable device 1000 of the present disclosure can have at least two folding configurations, thereby improving a user experience.

In some embodiments, at least one pair of adjacent sub-frame plates 1013 located on the primary folding axis 1011 are connected by two first folding hinges 1021. The two first folding hinges 1021 are connected by a first base plate 1026.

The connection by the two first folding hinges 1021 enhances the frictional damping force. The two first folding hinges 1021 are connected by the first base plate 1026, thereby improving the stability of the foldable device 1000 of the present disclosure.

Figure 20:
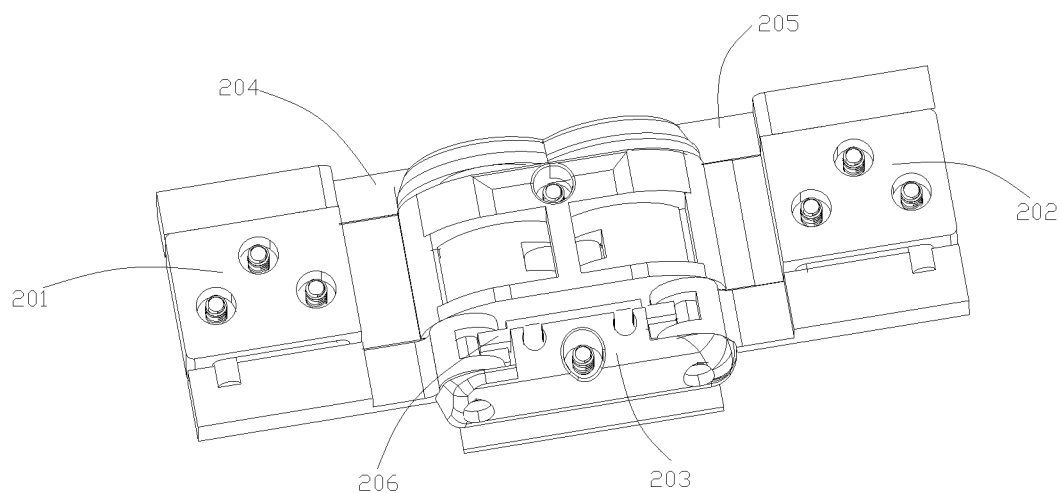
FIG. 20 is a schematic diagram of a hinge structure of a foldable device from a first view according to the present disclosure.
Figure 21:
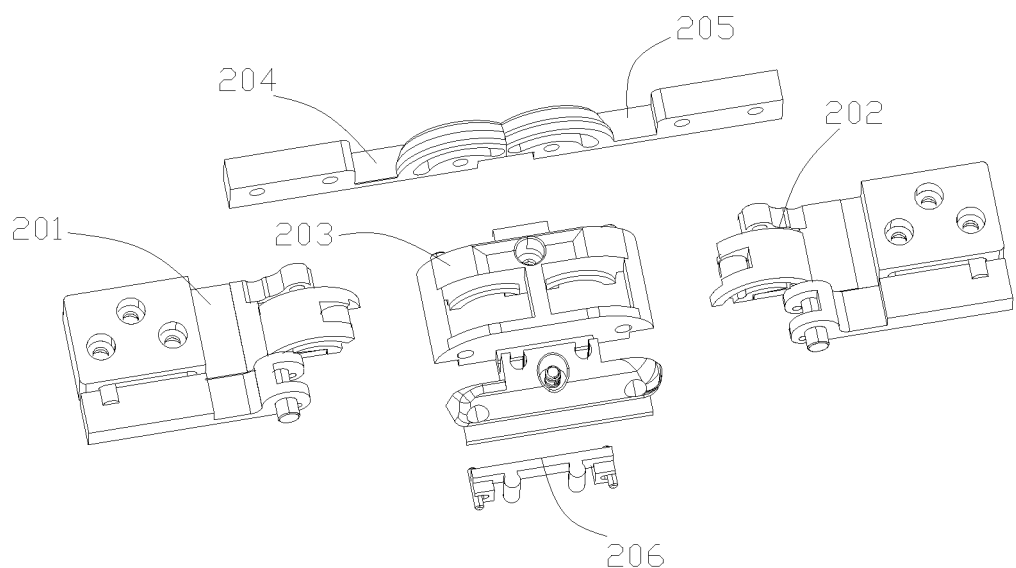
FIG. 21 is an exploded schematic diagram of FIG. 20.
Figure 22:
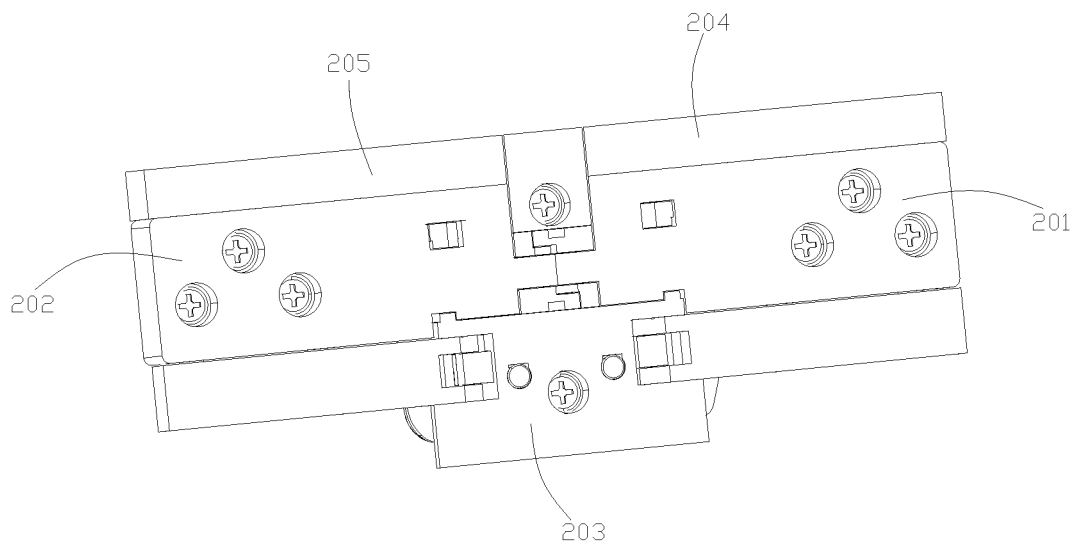
FIG. 22 is a schematic diagram of a hinge structure of a foldable device from a second view according to the present disclosure.
Figure 23:
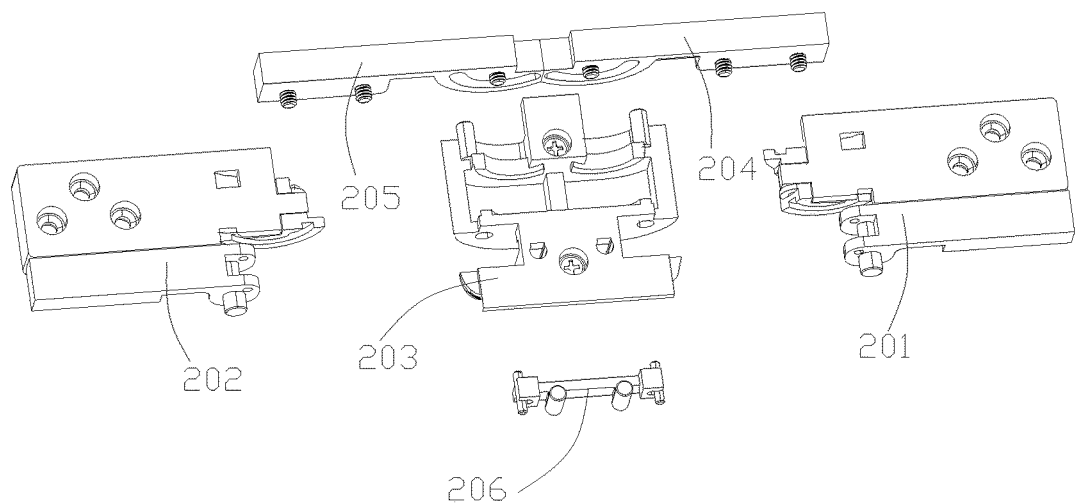
FIG. 23 is an exploded schematic diagram of FIG. 22.
Figure 24:
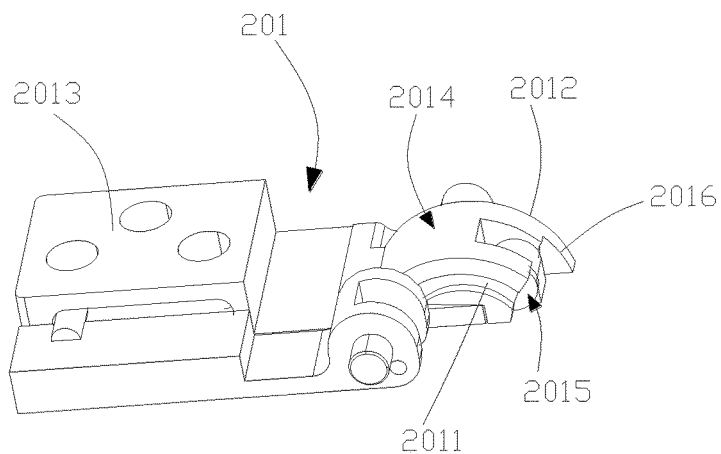
FIG. 24 is a schematic diagram of a third rotating member of a hinge structure of a foldable device according to the present disclosure.
Figure 25:
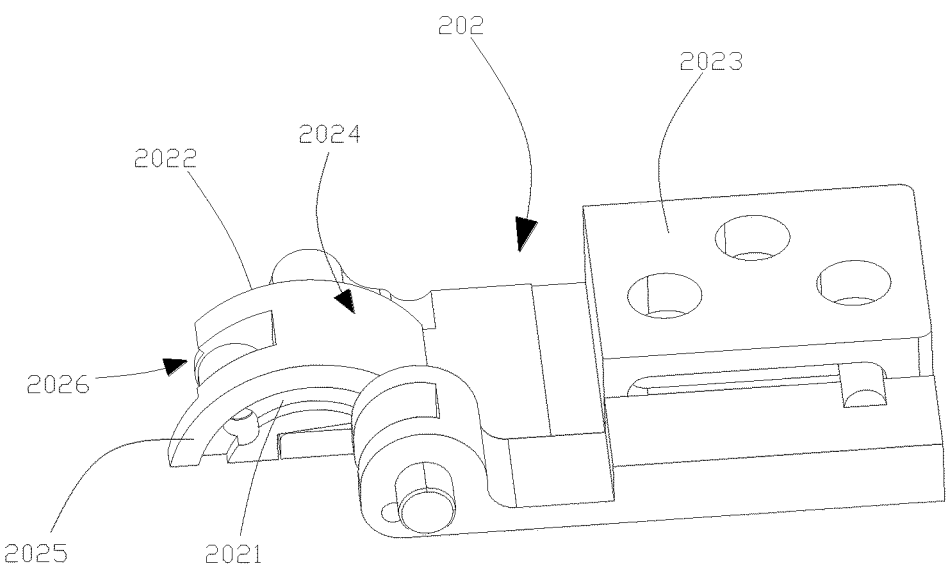
FIG. 25 is a schematic diagram of a fourth rotating member of a hinge structure of a foldable device according to the present disclosure.
Figure 26:
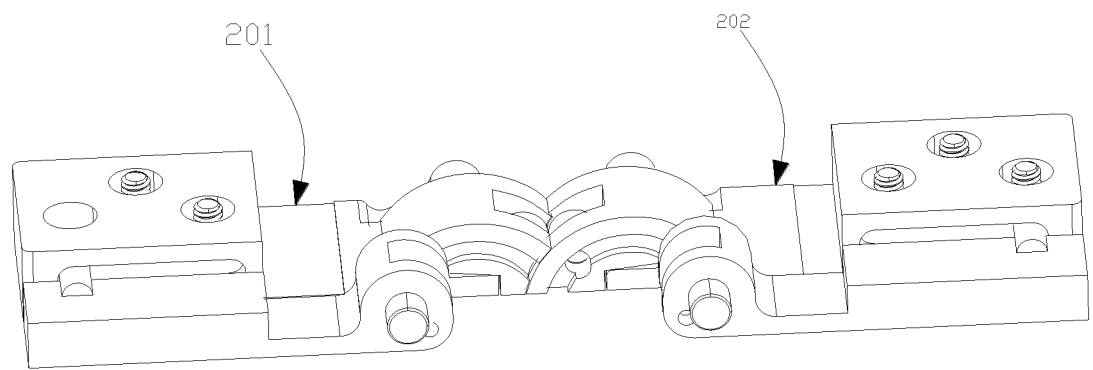
FIG. 26 is a schematic assembled diagram of a third rotating member and a fourth rotating member of a hinge structure of a foldable device according to the present disclosure.
Figure 27:
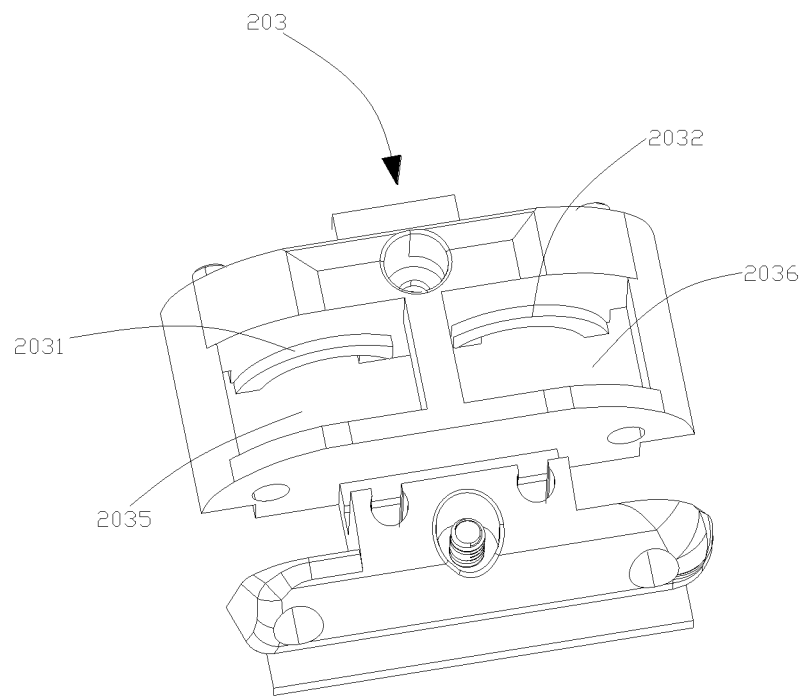
FIG. 27 is a schematic diagram of a second base of a hinge structure of a foldable device from a first view according to the present disclosure.
Figure 28:
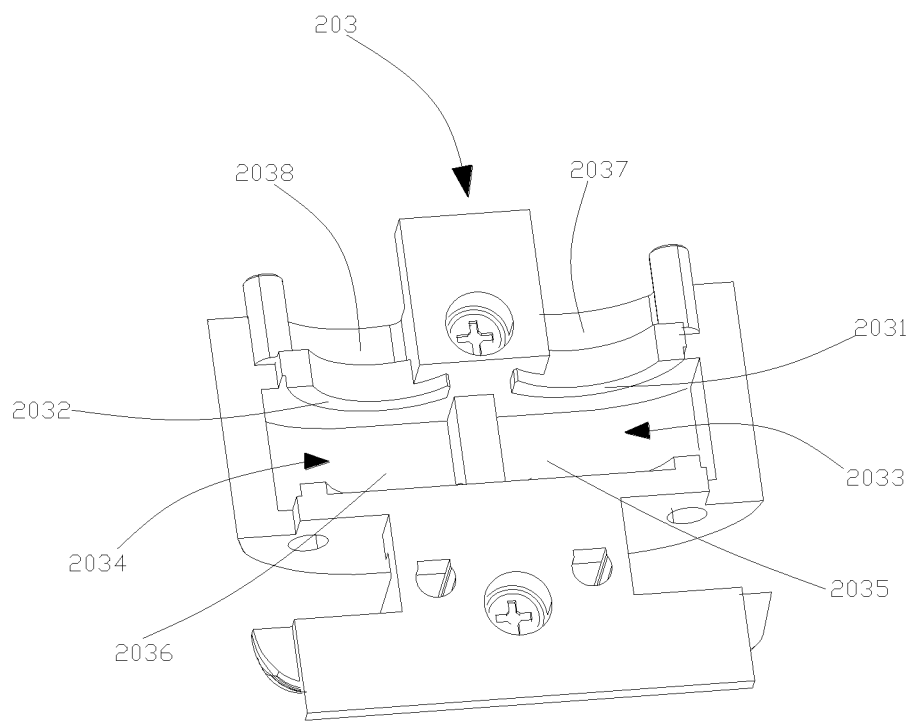
FIG. 28 is a schematic diagram of a second base of a hinge structure of a foldable device from a second view according to the present disclosure.
Figure 29:
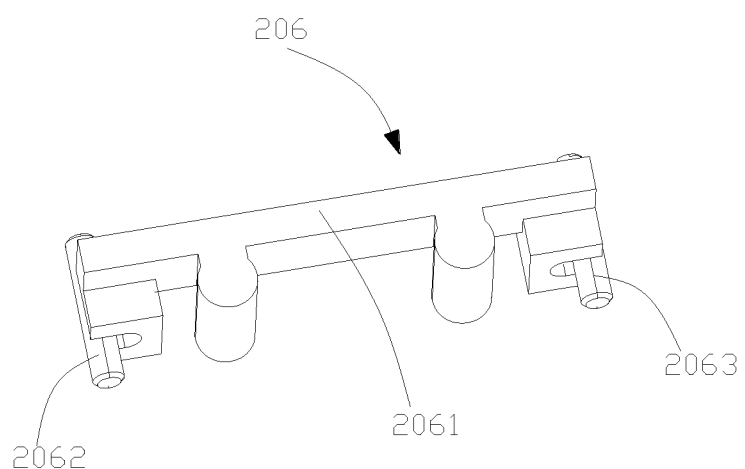
FIG. 29 is a schematic diagram of a second synchronizing mechanism of a hinge structure of a foldable device according to the present disclosure.

Referring to FIGS. 18 and 20 to 28, FIG. 20 is a schematic diagram of a hinge structure of a foldable device 1000 from a first view according to the present disclosure, FIG. 21 is an exploded schematic diagram of FIG. 20, FIG. 22 is a schematic diagram of a hinge structure of a foldable device 1000 from a second view according to the present disclosure, FIG. 23 is an exploded schematic diagram of FIG. 22, FIG. 24 is a schematic diagram of a third rotating member 201 of a hinge structure of a foldable device 1000 according to the present disclosure, FIG. 25 is a schematic diagram of a fourth rotating member 202 of a hinge structure of a foldable device 1000 according to the present disclosure, FIG. 26 is a schematic assembled diagram of the third rotating member 201 and the fourth rotating member 202 of a hinge structure of a foldable device 1000 according to the present disclosure, FIG. 27 is a schematic diagram of f a second base 203 of a hinge structure of a foldable device 1000 from a first view according to the present disclosure, and FIG. 28 is a schematic diagram of a second base 203 of a hinge structure of a foldable device 1000 from a second view according to the present disclosure.

Further, the folding mechanism 102 further includes: a hinge structure including a third rotating member 201, a fourth rotating member 202, and a second base 203, wherein an end of the third rotating member 201 is rotatably connected to the second base 203, and an end of the fourth rotating member 202 is rotatably connected to the second base 203; wherein at least one pair of adjacent sub-frame plates 1013 located on the primary folding axis 1011 are connected by a first hinge structure 1024, wherein a side of the other end of the third rotating member 201 of the first hinge structure 1024 is connected to one sub-frame plate 1013 of at least one pair of adjacent sub-frame plates 1013 located on the primary folding axis 1011, and a side of the other end of the fourth rotating member 202 of the first hinge structure 1024 is connected to the other sub-frame plate 1013 of at least one pair of adjacent sub-frame plates 1013 located on the primary folding axis 1011.

Specifically, take providing one secondary folding axis 1012 for example, the frame plate 101 is divided into four sub-frame plates 1013, the primary folding axis 1011 has two pairs of adjacent sub-frame plates 1013, the pair of adjacent sub-frame plates 1013 located on the primary folding axis 1011 is connected by two first folding hinges 1021, and the other pair of adjacent sub-frame plates 1013 located on the primary folding axis 1011 is connected by the first hinge structure 1024. The first hinge structure 1024 only functions as a hinge, and no damping mechanism is provided to the first folding hinge 1021. Thus, the first hinge structure 1024 is additionally provided on the primary folding axis 1011, in case of the primary folding axis 1011 providing with a first folding hinge 1021. As such, the foldable device 1000 can be hovered by the first folding hinge 1021, and the stability of folding of the foldable terminal in the primary folding axis 1011 can be improved by the first hinge structure 1024. Therefore, the number of the first folding hinges 1021 can be reduced, and the weight of the foldable terminal in the present disclosure can be reduced.

In some embodiments, the at least one pair of adjacent sub-frame plates 1013 located on the at least one secondary folding axis 1012 are connected by a second hinge structure 1023. A side of the other end of the third rotating member 201 of the second hinge structure 1023 is connected to one sub-frame plate 1013 of at least one pair of adjacent sub-frame plates 1013 located on the secondary folding axis 1012, and a side of the other end of the fourth rotating member 202 of the second hinge structure 1023 is connected to the other sub-frame plate 1013 of at least one pair of adjacent sub-frame plates 1013 located on the secondary folding axis 1012. Any one of the secondary axis 1012 has two pairs of the sub-frame plates 1013. The second hinge structure 1023 only functions as a hinge, and no damping mechanism is provided to the second folding hinge 1022. Thus, the first hinge structure 1023 is additionally provided, in case of the second folding hinge 1022 providing with a secondary folding axis 1012. As such, the foldable device 1000 can be hovered by the second folding hinge 1022, and the stability of folding of the foldable terminal in the secondary folding axis 1012 can be improved by the second hinge structure 1023. Therefore, the number of the second folding hinges 1022 can be reduced, and the weight of the foldable terminal in the present disclosure can be reduced.

Further, the at least one pair of adjacent sub-frame plates 1013 located on the at least one secondary folding axis 1012 are connected by the second hinge structure 1023 and the second folding hinge 1022, and the first base 30 of the second folding hinge 1022 is connected to the second base 203 of the second hinge structure 1023 by a connecting plate. The secondary folding axis 1012 has two pairs of adjacent sub-frame plates 1013, two pairs of adjacent sub-frame plates 1013 or one pair of adjacent sub-frame plates 1013 on the secondary folding axis 1012 are connected by the second hinge structure 1023 and the second folding hinge 1022, and the first base 30 of the second folding hinge 1022 is connected by to the second base 203 of the second hinge structure 1023 the connecting plate, thereby improving the stability of folding of the foldable terminal in the direction of the secondary folding axis 1012.

Specifically, the secondary folding axis 1012 is divided into a first folding section and a second folding section by the primary folding axis 1011, a pair of adjacent sub-frame plates 1013 located on the first folding section are connected by the second hinge structure 1023 and the second folding hinge 1022, and a pair of adjacent sub-frame plates 1013 located on the second folding section are connected by the second hinge structure 1023 and the second folding hinge 1022. A first base 30 of the second folding hinge 1022 located on the first folding section is connected to a second base 203 of the second hinge structure 1023 located on the second folding section by a first connecting plate 1027. A first base 30 of the second folding hinge 1022 located on the second folding section is connected to a second base 203 of the second hinge structure 1023 located on the second folding section by a second connecting plate 1028. That is, the secondary folding axis 1012 has two pairs of adjacent sub-frame plates 1013, and the two pairs of adjacent sub-frame plates 1013 on the secondary folding axis 1012 are connected through the second hinge structure 1023 and the second folding hinge 1022.

In some embodiments, the first connecting plate 1027 and the second connecting plate 1028 are connected by a third hinge structure 1025. A side of the other end of the third rotating member 201 of the third hinge structure 1025 is connected to the first connecting plate 1027, and a side of the other end of the fourth rotating member 202 of the third hinge structure 1025 is connected to the second connecting plate 1028.

The first connecting plate 1027 and the second connecting plate 1028 are connected by the third hinge structure 1025, thereby improving the consistency of the two pairs of adjacent sub-frame plates 1013 located on the secondary folding axis 1012 when folded, thereby improving the user experience.

Referring to FIGS. 16-19, FIG. 19 is a schematic diagram of a folding housing of a foldable device 1000 provided herein. Further, in some embodiments, the foldable device 1000 further includes: a first folding housing 106 provided at a bending region 1015 of the first folding section of the secondary folding axis 1012, wherein the first folding housing 106 is provided at a side of the first connecting plate 1027 close to the frame plate 101, and the first folding housing 106 is connected to a side of the other end of the third rotating member 201 of the third hinge structure 1025 and the first connecting plate 1027; a second folding housing 107 provided at a bending region 1015 of the second folding section of the secondary folding axis 1012, wherein the second folding housing 107 is provided at a side of the second connecting plate 1028 close to the frame plate 101, and the second folding housing 107 is connected to a side of the other end of the fourth rotating member 202 of the third hinge structure 1025 and the second connecting plate 1028; a third folding housing 108 provided on a side of the third hinge structure 1025 adjacent to the frame plate 101 and connected to the second base 203 of the third hinge structure 1025.

In the present disclosure, the first folding housing 106, the second folding housing 107, and the third folding housing 108 are provided to protect the bending region 1015 and the third hinge structure 1025 located on the secondary folding axis 1012. In addition, the first folding housing 106 is connected to the first connecting plate 1027, the second folding housing 107 is connected to the second connecting plate 1028, and the third hinge structure 1025 is connected to the first folding housing 106 and the second folding housing 107, so that the third hinge structure 1025 connects the first connecting plate 1027 and the second connecting plate 1028.

Further, the plurality of the sub-frame plates 1013 are provided with a first accommodating recess 1016 at a position corresponding to the first folding housing 106, the second folding housing 107 and the third folding housing 108 on the secondary folding axis 1012, and the first accommodating recess 1016 is provided for accommodating the first folding housing 106, the second folding housing 107 and the third folding housing 108, thereby reducing the overall thickness.

Referring to FIGS. 16-19, further, in some embodiments, the primary folding axis 1011 is divided into a plurality of primary folding segments by the secondary folding axis 1012, the bending region 1014 of each folding segment of the primary folding axis 1011 is provided with a primary folding housing 109 connected to a first base 30 of the first folding hinge 1021 or a second base 203 of the first hinge structure 1024. The bending region 1014 located on the primary folding axis 1011 is protected by a primary folding housing 109.

Further, the plurality of the sub-frame plates 1013 are provided with a second accommodating cavity 1017 at a position corresponding to the primary folding housing 109 on the primary folding axis 1011, and the second accommodating cavity 1017 is provided for accommodating the primary folding housing 109, thereby reducing the overall thickness.

Referring to FIGS. 15-17, further in some embodiments, the foldable device 1000 further includes a protective housing 103, each of the sub-frame plates 1013 is provided with the protective housing 103, the protective housing 103 is connected to the sub-frame plate 1013, and the protective housing 103 is provided on a side of the sub-frame plate away from the folding mechanism 102. The sub-frame plate 1013 can be protected by the protective housing 103, and the protective housing 103 and the sub-frame plate 1013 are in one-to-one correspondence.

Referring to FIGS. 20 to 29, in some embodiments, the second base 203 is provided with a third arcuate rail 2031 or a third arcuate chute 2011, and the third rotating member 201 is provided with a third arcuate chute 2011 or a third arcuate rail 2031, wherein the third arcuate rail 2031 or the third arcuate chute 2011 cooperates with the third arcuate chute 2011 or the third arcuate rail 2031. Specifically, the second base 203 is provided with a third arcuate rail 2031, and the third rotating member 201 is provided with the third arcuate chute 2011 that cooperates with the third arcuate rail 2031. The third arcuate rail 2031 is engaged with the third arcuate chute 2011 so that an end of the third rotating member 201 is rotatably connected to the second base 203. It is contemplated that the third rotating member 201 may be rotatably connected to the second base 203 by a rotating shaft, so that the end of the third rotating member 201 is rotatably connected to the second base 203.

Further, a third recess 2033 is provided on a side of the second base 203, and the third arcuate rail 2031 is respectively provided on two opposite side walls of the third recess 2033. Specifically, the third rotating member 201 includes a third rotating block 2012 and a third rotating plate 2013, and the third rotating block 2012 is fixed at an end of the third rotating plate 2013. The third rotating block 2012 is located in the third recess 3033, both sides of the third rotating block 2012 are respectively provided with the third arcuate chute 2031 which cooperates with the third arcuate rail 2011. An arcuate surface 2014 is provided on a surface of the third rotating block 2012 close to a bottom of the third recess 2033, so that friction between the third rotating block 2012 and the third recess 2033 can be reduced. A third through hole 2035 is provided at the bottom of the third recess 2033, so that the contact between the third rotating block 2012 and the third recess 2033 can be reduced, thereby further reducing friction between the third rotating block 2012 and the third recess 2033.

In some embodiments, the second base 203 is provided with a fourth arcuate rail 2032 or a fourth arcuate chute 2021, and the fourth rotating member 202 is provided with a fourth arcuate chute 2021 or a fourth arcuate rail 2032, wherein the fourth arcuate rail 2032 or the fourth arcuate chute 2021 provided on the second base 203 is cooperated with the fourth arcuate chute 2021 or the fourth arcuate rail 2032 provided on the fourth rotating member 202. Specifically, the fourth arcuate rail 2032 is provided on the second base 203 and the fourth arcuate chute 2021 is provided on the fourth rotating member 202, and the fourth arcuate rail 2032 is cooperated with the fourth arcuate chute 2021. The fourth arcuate chute 2021 is engaged by the fourth arcuate rail 2032 so that an end of the fourth rotating member 202 is rotatably connected to the second base 203. It is contemplated that the fourth rotating member 202 may be rotatably connected to the second base 203 by a rotating shaft so that the end of the fourth rotating member 202 is rotatably connected to the second base 203.

Further, a fourth recess 2034 is provided on a side of the second base 203, and the fourth arcuate rail 2032 or the fourth arcuate chute 2021 is provided on two opposite side walls of the fourth recess 2034, respectively. Specifically, the fourth rotating member 202 includes a fourth rotating block 2022 and a fourth rotating plate 2023, the fourth rotating block 2022 is fixed at an end of the s fourth rotating plate 2023, and the fourth rotating block 2022 is located in the fourth recess 2034. Both sides of the fourth rotating block 2022 are respectively provided with the fourth arcuate chute 2021 which cooperates with the fourth arcuate rail 2032. An arcuate surface 2024 is provided on a surface of the fourth rotating block 2022 close to a bottom of the fourth recess 2034, so that friction between the fourth rotating block 2022 and the fourth recess 2034 can be reduced. A fourth through hole 2036 is provided at the bottom of the fourth recess 2034, so that contact between the fourth rotating block 2022 and the fourth recess 2034 can be reduced, thereby further reducing friction between the fourth rotating block 2022 and the fourth recess 2034.

In some embodiments, when an included angle between the third rotating member 201 and the fourth rotating member 202 is 180°, an end of the third rotating member 201 abuts against an end of the fourth rotating member 202. The included angle between the third rotating member 201 and the fourth rotating member 202 can be defined to range from 0° to 180°, thereby avoiding an excessive rotation. Specifically, the third recess 2033 communicates with the fourth recess 2034, and when the included angle between the third rotating member 201 and the fourth rotating member 202 is 180°, an end of the third rotating block 2012 abuts against an end of the fourth rotating block 2022, a third notch 2015 is provided on a surface of the third rotating block 2012 contacting with the fourth rotating block 2022, and a third clamping block 2025 which is cooperated with the third notch 2015 is provided on the fourth rotating block 2022. The third rotating block 2012 and the fourth rotating block 2022 are engaged by the third notch 2015 and the third clamping block 2025, and define an angle of 0° to 180° between the third rotating member 201 and the fourth rotating member 202. Further, a fourth notch 2026 is provided on a surface of the fourth rotating block 2026 contacting with the third rotating block 2012, and the third rotating block 2012 is provided with a fourth clamping block 2016 which cooperates with the fourth notch 2026.

Further, the folding hinge further includes a third end cover 204 provided on a side of the second base 203, and the third end cover 204 is connected to the third rotating member 201. Specifically, a third connecting hole 2037 communicating with the third recess 2033 is provided on the second base 203 and at a side of the second base 203 provided with the third end cover 204, and the third end cover 204 is connected to the third rotating member 201 through the third connecting hole 37. The third end cover 204 is provided to prevent dust or impurities from entering the third recess 2033.

In addition, the folding hinge further includes a fourth end cover 205 provided on a side of the second base 203, and the fourth end cover 205 is connected to the fourth rotating member 202. Specifically, a fourth connecting hole 2038 communicating with the fourth recess 2034 is provided on the second base 203 and at a side of the second base 203 provided with the fourth end cover 205, and the fourth end cover 205 is connected to the fourth rotating member 202 through the fourth connecting hole 2038. The fourth end cover 205 is provided to prevent dust or impurities from entering the fourth recess 2034.

Referring to FIGS. 20-29, FIG. 29 is a schematic diagram of a second synchronizing mechanism 206 of a hinge structure of a foldable device 1000 according to the present disclosure. In some embodiments, the hinge structure further includes a second synchronizing mechanism 206 connected between the third rotating member 201 and the fourth rotating member 202, the third synchronizing mechanism 206 lead the third rotating member 201 and the fourth rotating member 202 to rotate synchronically towards or away from each other.

The second synchronizing mechanism 206 is provided to rotate synchronically the third rotating member 201 and the fourth rotating member 202 towards or away from each other, such that the third rotating member 201 and the fourth rotating member 202 remains a same rotating angle.

Further, the second synchronizing mechanism 206 includes a third link 2061, wherein an end of the third link 2061 is hinged to the third rotating member 201, and the other end of the third link 2061 is hinged to the fourth rotating member 202. The third rotating member 201 and the fourth rotating member 202 are driven by the third link 2061 to rotate synchronically towards or away from each other. Specifically, the end of the third link 2061 is hinged to the third rotating plate 2013 of the third rotating member 201, and the other end of the third link 2061 is hinged to the fourth rotating plate 2023 of the fourth rotating member 202.

Further, the second synchronizing mechanism 206 further includes a third eccentric shaft 2062 and a fourth eccentric shaft 2063. The third eccentric shaft 2062 and a rotating center of the third rotating member 201 rotating about the second base 203 are axially paralleled to the third rotating member 201. The fourth eccentric shaft 2063 and a rotating center of the fourth rotating member 202 rotating about the second base 203 are axially paralleled to the fourth rotating member 202. An end of the third link 2061 is hinged to the third eccentric shaft 2062, and the other end of the third link 2061 is hinged to the fourth eccentric shaft 2063.

Figure 30:
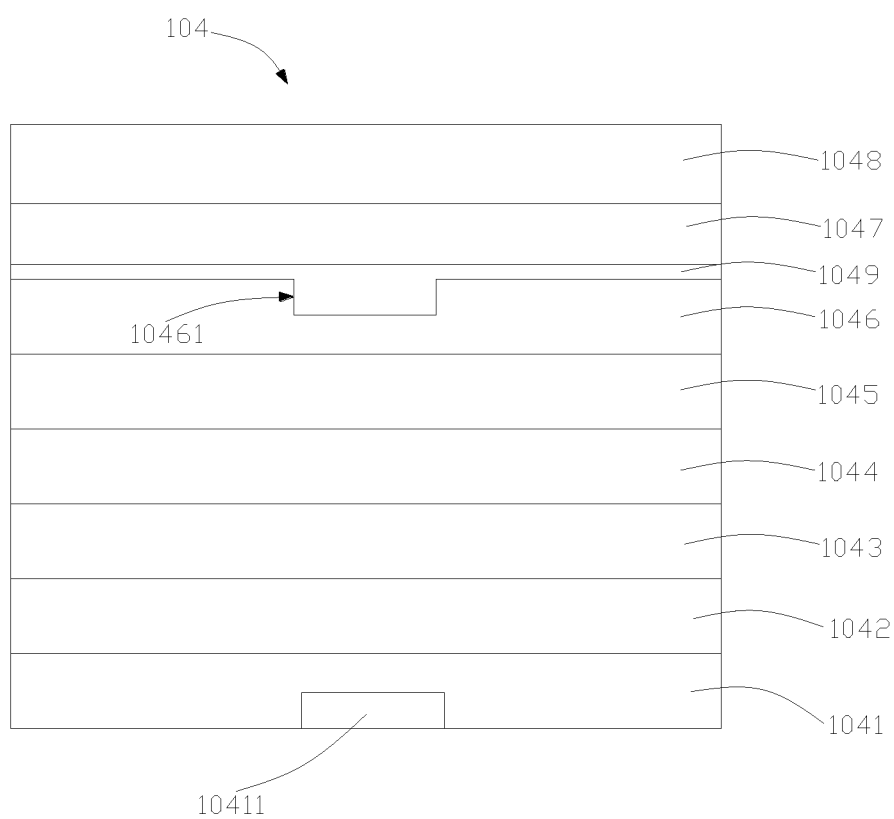
FIG. 30 is a schematic diagram of a display panel of a display device according to the present disclosure.

Referring to FIGS. 16 and 30, FIG. 30 is a schematic diagram of a display panel 104 of a display device according to the present disclosure.

Accordingly, an embodiment of the present disclosure further provides a display device, wherein the display device further includes: the foldable device 1000 as described above; a display panel 104 provided on a side of the frame plate 101 of the foldable device 1000. Specifically, the display panel 104 is provided on a side of the frame plate 101 close to the folding mechanism 102.

The display panel 104 includes a steel sheet layer 1041, a support film layer 1042, an OLED light-emitting layer 1043, a polarizing plate 1044, a second optical transparent adhesive layer 1045, an ultra-thin glass 1046, a first optical transparent adhesive layer 1047, and a protective film layer 1048, which are stacked in sequence. The ultra-thin glass layer 1046 is provided with a first thinning region 10461 at the bending region of the primary folding axis 1011 and the secondary folding axis 1012.

The first thinning region 10461 is located on a side of the ultra-thin glass layer 1046 close to the first optical transparent adhesive layer 1047. A thickness compensation coating 1049 is provided between the ultra-thin glass layer 1046 and the first optical transparent adhesive layer 1047. The thickness compensation coating 1049 fills the first thinning region 10461, and a material of the thickness compensation coating 1049 includes any one of polyimide, polyurethane, polymethyl methacrylate, and resin. The refractive index of the material of the thickness compensation coating 1049 is close to the refractive index of the ultra-thin glass, so that the optical abnormality of the first thinning region 10461 can be avoided by providing the thickness compensation coating 1049.

In the present disclosure, the ultra-thin glass layer is locally thinned, and the first thinning region 10461 is provided corresponding to the bending region. The first thinning region 10461 forms a cross thinning region at the position where the primary folding axis 1011 and the auxiliary folding axis 1012 intersect, thereby improving the bending performance of the ultra-thin glass 1046 in the bending region and ensuring the overall mechanical performance.

Further, the steel sheet layer 1041 is provided with a second thinning region 10411 in the bending region of the primary folding axis 1011 and the secondary folding axis 1012. In the present disclosure, the steel sheet layer is locally thinned, and the second thinning region 10411 corresponds to the bending region, and the second thinning region 10411 forms a cross thinning region at the position where the primary folding axis 1011 and the auxiliary folding axis 1012 intersect, thereby improving the bending performance of the steel sheet layer 1041 in the bending region and ensuring the overall mechanical performance.

The advantageous effects of the display device provided in the embodiment of the present invention are the same as those of the foldable device 1000 provided in the above-mentioned technical solution, and details are not described herein.

In some embodiments, the display device further includes: a pressing strip 105 provided on the display panel 104 and adhesively connected to the frame plate 101. The display panel 104 is fixed to the frame plate 101 by the pressing strip 105.

The present disclosure has been described in detail with reference to a foldable device and a display device according to the embodiments, in which specific examples are used to illustrate the principles and applications of the present disclosure. The description of the above embodiments is merely provided to assist in understanding the method of the present disclosure and the core concepts thereof. At the same time, variations will occur to those skilled in the art in both the detailed description and the scope of disclosure in accordance with the teachings of the present disclosure. In summary, the present description should not be construed as limiting the disclosure.

What is claimed is:

1. A foldable device, comprising:
    a frame plate;
    one primary folding axis;
    at least one secondary folding axis, wherein the at least one secondary folding axis intersects the primary folding axis to divide the frame plate into a plurality of sub-frame plates; and
    a folding mechanism including a first folding hinge and a second folding hinge;
    wherein at least one pair of adjacent sub-frame plates located on the primary folding axis are connected by the first folding hinge, at least one pair of adjacent sub-frame plates located on the at least one secondary folding axis are connected by the second folding hinge, and any one of the sub-frame plates is connected to at least one of the first folding hinge or the second folding hinge;
    wherein each of the first folding hinge and the second folding hinge comprises:
    a first rotating member;
    a second rotating member; and
    a first base, wherein an end of the first rotating member is rotatably connected to the first base, and an end of the second rotating member is rotatably connected to the first base;
    wherein a side of another end of the first rotating member of the first folding hinge is connected to one of the at least one pair of adjacent sub-frame plates located on the primary folding axis, and a side of another end of the second rotating member of the first folding hinge is connected to another of the at least one pair of adjacent sub-frame plates located on the primary folding axis;
    wherein a side of another end of the first rotating member of the second folding hinge is connected to one of the at least one pair of adjacent sub-frame plates located on the at least one secondary folding axis, and a side of another end of the second rotating member of the second folding hinge is connected to another of the at least one pair of adjacent sub-frame plates located on the at least one secondary folding axis; and
    wherein each of the first folding hinge and the second folding hinge further comprises:
    a first damping mechanism connected to the first base and the first rotating member; and
    a second damping mechanism connected to the first base and the second rotating member;
    when the first rotating member is rotated relative to the first base from a first position to a second position by an external force, the first damping mechanism generates a damping force that prevents the first rotating member from rotating, and when the external force is removed, the first damping mechanism holds the first rotating member in the second position;
    when the second rotating member is rotated relative to the first base from a third position to a fourth position by the external force, the second damping mechanism generates the damping force that prevents the second rotating member from rotating, and when the external force is removed, the second damping mechanism holds the second rotating member in the fourth position.

2. The foldable device of claim 1, wherein the first damping mechanism comprises:
    a first rotating shaft provided on the first base;
    a first movable portion, wherein an end of the first movable portion is rotatably connected to the first rotating shaft, and another end of the first movable portion is rotatably connected to the first rotating member; and
    a first damping portion provided on the first rotating shaft;
    when the first rotating member is rotated relative to the first base from the first position to the second position by the external force, the first movable portion and the first damping portion are relatively rotated, and a frictional damping force is generated.

3. The foldable device of claim 2, wherein, when the first rotating member is rotated relative to the first base from the first position to the second position by an external force, the first movable portion and the first damping portion are relatively rotated to a set position, and the frictional damping force is generated between the first movable portion and the first damping portion; when the external force is removed, the first movable portion holds the first rotating member in the second position.

4. The foldable device of claim 2, wherein the first damping portion comprises:
    a first slider slidably disposed on the first rotating shaft; and
    a first elastic member provided between the first slider and the first base;
    when the first rotating member is rotated relative to the first base from the first position to the second position by the external force, the first movable portion and the first slider are relatively rotated and press the first elastic member, and the frictional damping force is generated between the first movable portion and the first slider by the first elastic member.

5. The foldable device of claim 1, wherein the second damping mechanism comprises:
    a second rotating shaft provided on the first base;
    a second movable portion, wherein an end of the second movable portion is rotatably connected to the second rotating shaft, and another end of the second movable portion is connected to the second rotating member; and
    a second damping portion provided on the second rotating shaft;
    when the second rotating member is rotated relative to the first base from the third position to the fourth position by the external force, the second movable portion and the second damping portion are relatively rotated, and a frictional damping force is generated.

6. The foldable device according to claim 5, wherein, when the second rotating member is rotated relative to the first base from the third position to the fourth position by the external force, the second movable portion and the second damping portion are relatively rotated to a set position, and the frictional damping force is generated between the second movable portion and the second damping portion; when the external force is removed, the frictional damping force holds the second rotating member in the fourth position.

7. The foldable device of claim 5, wherein the second damping portion comprises:
- a second slider slidably disposed on the second rotating shaft; and
- a second elastic member provided between the second slider and the first base;
- when the second rotating member is rotated relative to the first base from the third position to the fourth position by the external force, the second movable portion and the second slider are relatively rotated and press the second elastic member, and the frictional damping force is generated between the second movable portion and the second slider by the second elastic member.

8. The foldable device of claim 1, wherein at least one pair of adjacent sub-frame plates located on the primary folding axis are connected by two first folding hinges;
- wherein the two first folding hinges are connected through a first base plate.

9. The foldable device of claim 1, wherein the folding mechanism further comprises:
- a hinge structure including a third rotating member, a fourth rotating member, and a second base, wherein an end of the third rotating member is rotatably connected to the second base, and an end of the fourth rotating member is rotatably connected to the second base;
- wherein the at least one pair of adjacent sub-frame plates located on the primary folding axis are connected by a first hinge structure,
- wherein a side of another end of the third rotating member of the first hinge structure is connected to one of the at least one pair of adjacent sub-frame plates located on the primary folding axis, and a side of another end of the fourth rotating member of the first hinge structure is connected to another of the at least one pair of adjacent sub-frame plates located on the primary folding axis.

10. The foldable device of claim 9, wherein the at least one pair of adjacent sub-frame plates located on the at least one secondary folding axis are connected by a second hinge structure,
- wherein a side of another end of the third rotating member of the second hinge structure is connected to one of the at least one pair of adjacent sub-frame plates located on the secondary folding axis, and a side of another end of the fourth rotating member of the second hinge structure is connected to another of the at least one pair of adjacent sub-frame plates located on the secondary folding axis.

11. The foldable device of claim 10, wherein the at least one pair of adjacent sub-frame plates located on the at least one secondary folding axis are connected to the second folding hinge by the second hinge structure.

12. The foldable device of claim 11, wherein the secondary folding axis is divided into a first folding section and a second folding section by the primary folding axis, a pair of adjacent sub-frame plates located on the first folding section are connected by the second hinge structure and the second folding hinge, and a pair of adjacent sub-frame plates located on the second folding section are connected by the second hinge structure and the second folding hinge; wherein the first base of the second folding hinge located on the first folding section is connected to the second base of the second hinge structure located on the second folding section by a first connecting plate; and the first base of the second folding hinge located on the second folding section is connected to the second base of the second hinge structure located on the second folding section by a second connecting plate.

13. The foldable device of claim 12, wherein the first connecting plate and the second connecting plate are connected by a third hinge structure,
- wherein a side of another end of the third rotating member of the third hinge structure is connected to the first connecting plate, and a side of another end of the fourth rotating member of the third hinge structure is connected to the second connecting plate.

14. The foldable device of claim 13, further comprising:
- a first folding housing provided at a bending region of the first folding section of the secondary folding axis, wherein the first folding housing is provided at a side of the first connecting plate close to the frame plate and is connected to a side of another end of the third rotating member of the third hinge structure, and the first connecting plate;
- a second folding housing provided at a bending region of the second folding section of the secondary folding axis, wherein the second folding housing is provided at a side of the second connecting plate close to the frame plate and is connected to a side of another end of the fourth rotating member of the third hinge structure, and the second connecting plate; and
- a third folding housing provided on a side of the third hinge structure close to the frame plate and connected to the second base of the third hinge structure.

15. The foldable device of claim 9, wherein the hinge structure further comprises:
- a second synchronizing mechanism connected between the third rotating member and the fourth rotating member, wherein the second synchronizing mechanism leads the third rotating member and the fourth rotating member to rotate synchronically towards each other or away from each other.

16. The foldable device of claim 15, wherein the second synchronization mechanism comprises:
- a third link, wherein an end of the third link is hinged to the third rotating member, and another end of the third link is hinged to the fourth rotating member.

17. The foldable device of claim 16, wherein the second synchronizing mechanism further comprises:
- a third eccentric shaft provided on the third rotating member and paralleled axially to a rotating center of the third rotating member rotating about the second base; and
- a fourth eccentric shaft provided on the fourth rotating member and paralleled axially to a rotating center of the fourth rotating member rotating about the second base;
- wherein an end of the third link is hinged to the third eccentric shaft, and another end of the third link is hinged to the fourth eccentric shaft.

18. A display device, comprising:
- a foldable device; and
- a display panel;
- wherein the foldable device comprises:
- a frame plate;
- one primary folding axis;
- at least one secondary folding axis, wherein the at least one secondary folding axis intersects the primary folding axis to divide the frame plate into a plurality of sub-frame plates; and a folding mechanism including a first folding hinge and a second folding hinge;

wherein at least one pair of adjacent sub-frame plates located on the primary folding axis are connected by the first folding hinge, at least one pair of adjacent sub-frame plates located on the at least one secondary folding axis are connected by the second folding hinge, and any one of the sub-frame plates is connected to at least one of the first folding hinge or the second folding hinge;

wherein the display panel is disposed on a side of the frame plate of the foldable device;

wherein each of the first folding hinge and the second folding hinge comprises:

a first rotating member;

a second rotating member; and a first base, wherein an end of the first rotating member is rotatably connected to the first base, and an end of the second rotating member is rotatably connected to the first base;

wherein a side of another end of the first rotating member of the first folding hinge is connected to one of the at least one pair of adjacent sub-frame plates located on the primary folding axis, and a side of another end of the second rotating member of the first folding hinge is connected to another of the at least one pair of adjacent sub-frame plates located on the primary folding axis;

wherein a side of another end of the first rotating member of the second folding hinge is connected to one of the at least one pair of adjacent sub-frame plates located on the at least one secondary folding axis, and a side of another end of the second rotating member of the second folding hinge is connected to another of the at least one pair of adjacent sub-frame plates located on the at least one secondary folding axis;

wherein the folding mechanism further comprises:

a hinge structure including a third rotating member, a fourth rotating member, and a second base, wherein an end of the third rotating member is rotatably connected to the second base, and an end of the fourth rotating member is rotatably connected to the second base;

wherein the at least one pair of adjacent sub-frame plates located on the primary folding axis are connected by a first hinge structure, wherein a side of another end of the third rotating member of the first hinge structure is connected to one of the at least one pair of adjacent sub-frame plates located on the primary folding axis, and a side of another end of the fourth rotating member of the first hinge structure is connected to another of the at least one pair of adjacent sub-frame plates located on the primary folding axis.

19. The display device of claim 18, wherein the at least one pair of adjacent sub-frame plates located on the at least one secondary folding axis are connected by a second hinge structure, wherein a side of another end of the third rotating member of the second hinge structure is connected to one of the at least one pair of adjacent sub-frame plates located on the secondary folding axis, and a side of another end of the fourth rotating member of the second hinge structure is connected to another of the at least one pair of adjacent sub-frame plates located on the secondary folding axis.

20. The display device of claim 19, wherein the at least one pair of adjacent sub-frame plates located on the at least one secondary folding axis are connected to the second folding hinge by the second hinge structure.

* * * * *